United States Patent
Kim

(10) Patent No.: US 9,437,703 B2
(45) Date of Patent: Sep. 6, 2016

(54) NON-VOLATILE MEMORY DEVICE INCLUDING NANO FLOATING GATE WITH NANOPARTICLE AND METHOD FOR FABRICATING THE SAME

(71) Applicant: SK INNOVATION CO., LTD., Seoul (KR)

(72) Inventor: Jun-Hyung Kim, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 0 days.

(21) Appl. No.: 14/554,937

(22) Filed: Nov. 26, 2014

(65) Prior Publication Data

US 2015/0179807 A1    Jun. 25, 2015

(30) Foreign Application Priority Data

Dec. 19, 2013  (KR) .................. 10-2013-0159736

(51) Int. Cl.
| | | |
|---|---|---|
| H01L 21/336 | (2006.01) | |
| H01L 29/49 | (2006.01) | |
| H01L 21/28 | (2006.01) | |
| H01L 29/66 | (2006.01) | |
| H01L 29/423 | (2006.01) | |
| H01L 51/05 | (2006.01) | |

(52) U.S. Cl.
CPC ..... *H01L 29/4966* (2013.01); *H01L 21/28273* (2013.01); *H01L 29/42332* (2013.01); *H01L 29/66825* (2013.01); *H01L 51/0529* (2013.01); *H01L 51/0533* (2013.01); *H01L 51/0537* (2013.01); *H01L 51/0591* (2013.01)

(58) Field of Classification Search
CPC .................. H01L 21/28273; H01L 29/7883; H01L 29/66825; H01L 29/42332; H01L 29/4966
USPC .......................... 438/263, 264, 594
See application file for complete search history.

(56) References Cited

U.S. PATENT DOCUMENTS

| | | | |
|---|---|---|---|
| 2006/0099430 A1* | 5/2006 | Subramanya .......... | B05D 1/185 428/447 |
| 2010/0193762 A1* | 8/2010 | Hsieh .................... | H01L 45/085 257/4 |
| 2010/0240208 A1 | 9/2010 | Lee et al. | |
| 2012/0130053 A1 | 5/2012 | Lee et al. | |
| 2013/0327392 A1 | 12/2013 | Weitekamp et al. | |

FOREIGN PATENT DOCUMENTS

| | | |
|---|---|---|
| JP | 2003-168606 | 6/2003 |
| WO | WO 2008/068873 | 6/2008 |

OTHER PUBLICATIONS

Brust, M. et al., Some recent advances in nanostructure preparation from gold and silver particles: a short topical review, Colloids and Surfaces A: Physicochemical and Engineering Aspects, 2002, pp. 175-186, vol. 202, No. 2.

Extended European Search Report issued by the European Patent Office on Jun. 2, 2015.

* cited by examiner

*Primary Examiner* — Hung Vu

(74) *Attorney, Agent, or Firm* — IP & T Group LLP

(57) ABSTRACT

A non-volatile memory device includes a floating gate for charging and discharging of charges over a substrate. The floating gate comprises a linker layer formed over the substrate and including linkers to be bonded to metal ions and metallic nanoparticles formed out of the metal ions over the linker layer.

19 Claims, 5 Drawing Sheets

NON-VOLATILE MEMORY DEVICE INCLUDING NANO FLOATING GATE WITH NANOPARTICLE AND METHOD FOR FABRICATING THE SAME

CROSS-REFERENCE TO RELATED APPLICATIONS

The present application claims priority of Korean Patent Application No. 10-2013-0159736, filed on Dec. 19, 2013, which is incorporated herein by reference in its entirety.

BACKGROUND

1. Field

Various embodiments of the present disclosure relate to a non-volatile memory device including a nano floating gate, and a method for fabricating the non-volatile memory device.

2. Description of the Related Art

The demand for flash memory, a kind of a non-volatile memory device, is increasing explosively in the mobile and digital industrial fields, such as in mobile phones, MP3 players, digital cameras, Universal Serial Buses (USB) and so forth.

NAND-type flash memory devices, which are presently commercialized, operate based on a change in the threshold voltage of a transistor. The change in threshold voltage is caused by the charge storage state of a floating gate. The floating gate is generally formed of polysilicon and may be charged or discharged. However, non-uniform polysilicon in the floating gate increases the variability of the threshold voltages of the device and operation voltages as high as about 5 to 10 V require a great deal of power consumption. Also, when scaled down, a deteriorated insulation layer may result in charge leakage from the floating gate and into the channel. This is a serious problem because it may result in the loss of stored data.

To solve these problems and achieve high reliability, stably retain charges, consume less power, operate at high speed, and have a high degree of integration, U.S. Pat. No. 8,093,129 discloses a nano-floating gate memory (NFGM) device, which is fabricated by forming a floating gate of nanometer-size particles (which may be simply referred to as nanoparticles). The floating gate is simply a storage node that stores a charge.

Since nanoparticles that are not electrically connected to each other store the charges, the nano-floating gate memory device may minimize the possibility of data loss caused by a deteriorated insulation layer and acquire excellent data retention characteristics. Also, the nano-floating gate memory device may be scaled down for decreased power consumption and, since it is suitable for performing a program and/or erase operation through direct tunneling at low voltages, its operation rate may be improved remarkably. Moreover, since the nano-floating gate memory device uses only a single transistor, it has many advantageous aspects, including the ability to achieve high degrees of integration.

However, the nano-floating gate memory device has the following drawbacks. It is difficult to densely form nanoparticles in the required area, the lower portion of the control gate, which does not allow for much variation in threshold voltages. Also, broad distributions in nanoparticle size may lead to wide threshold voltage distributions, which deteriorate the reproducibility and reliability of the device.

SUMMARY

Various embodiments are directed to a non-volatile memory device including a nano floating gate that may be scaled down to achieve low power consumption while having excellent operation stability, reproducibility, and reliability, and a method of fabricating the non-volatile memory device.

In an embodiment, a non-volatile memory device includes: a floating gate for charging and discharging of charges over a substrate, wherein the floating gate includes: a linker layer formed over the substrate and including linkers to be bonded to metal ions; and metallic nanoparticles formed out of the metal ions over the linker layer.

The non-volatile memory device may further include: a tunneling insulation layer interposed between the substrate and the floating gate; a gate insulation layer formed over the floating gate; and a control gate formed over the gate insulation layer.

The linkers may be organic molecules bonded to a surface of the substrate.

The floating gate may further include an inorganic oxide and/or a dielectric organic material that is bonded to the surface of the metallic nanoparticles.

The floating gate may further include an organic surfactant of one or more kinds bonded to the metal ions or the metallic nanoparticles.

The organic surfactant may be a nitrogen-containing organic material or a sulfur-containing organic material.

The organic surfactant may include a first organic material and a second organic material of different kinds. The first organic material may be a nitrogen-containing organic material or a sulfur-containing organic material and the second organic material may be a phase-transfer catalyst-based organic material.

The metallic nanoparticles may have an average particle diameter of about 0.5 to 3.0 nm.

The metallic nanoparticles may have a particle radius standard deviation of about ±20% or less.

The linker layer may be a self-assembled monomolecular layer of organic molecules formed over the substrate.

The linker layer may be a silane compound layer having at least one functional group selected from an amine group (—NH$_2$), a carboxyl group (—COOH), and a thiol group (—SH).

Each of the linkers may include: a first functional group bonded to the surface of the substrate; a second functional group bonded to the metal ions; and a chain group for coupling the first functional group and the second functional group with each other.

The metallic nanoparticles may be selected from the metal nanoparticles, metal oxide nanoparticles, metal nitride nanoparticles, metal carbide nanoparticles, and intermetallic compound nanoparticles.

The metallic nanoparticles may be arranged separately from each other to form a single layer (a layer one metallic nanoparticle in thickness).

The floating gate may have a vertical multi-stack structure where the linker layer and a nanoparticle layer, formed of the metallic nanoparticles, are alternately and repeatedly stacked.

In another embodiment, a non-volatile memory device includes: a floating gate for charging and discharging of charges over a substrate, wherein the floating gate includes:

dielectric material particle supporters formed over the substrate and linkers on the surface of the dielectric material particle supporters that are bonded to metal ions; and metallic nanoparticles formed out of the metal ions.

The non-volatile memory device may further include: a tunneling insulation layer interposed between the substrate and the floating gate; a gate insulation layer formed over the floating gate; and a control gate formed over the gate insulation layer.

The dielectric material particle supporters may form a single layer (one dielectric material particle supporter in thickness) or a multilayer supporter layer (multiple dielectric material particle supporters in thickness).

Each of the linkers may include a functional group selected from an amine group (—NH), a carboxyl group (—COOH), and a thiol group (—SH) to be bonded to metal ions.

The floating gate may further include at least one of an inorganic oxide and a dielectric organic material that is bonded to the surface of the metallic nanoparticles.

The floating gate may further include an organic surfactant of one or more kinds that is bonded to the metal ions or the metallic nanoparticles.

The organic surfactant may be a nitrogen-containing organic material or a sulfur-containing organic material.

The organic surfactant may include a first organic material and a second organic material of different kinds, and the first organic material may be a nitrogen-containing organic material or a sulfur-containing organic material, and the second organic material may be a phase-transfer catalyst-based organic material.

The metallic nanoparticles may have an average particle diameter of about 0.5 to 3.0 nm.

The metallic nanoparticles may have a particle radius standard deviation of about ±20% or less.

The metallic nanoparticles may be selected from metal nanoparticles, metal oxide nanoparticles, metal nitride nanoparticles, metal carbide nanoparticles, and intermetallic compound nanoparticles.

In another embodiment, a method for fabricating a non-volatile memory device includes: forming a tunneling insulation layer over a substrate; and forming a floating gate for charging and discharging of charges over the tunneling insulation layer, wherein the forming of the floating gate includes: forming a linker layer including linkers over the tunneling insulation layer; forming metal ions over the linker layer; and forming metallic nanoparticles out of the metal ions.

The metallic nanoparticles may be formed through reduction and growth of the metal ions.

The forming of the metallic nanoparticles may include applying energy to the metal ions.

The method may further include supplying an organic surfactant of one or more kinds before or during the application of energy.

The method may further include supplying at least one of an inorganic oxide and/or a dielectric organic material to the metallic nanoparticles.

The linker layer may be formed by applying a linker solution to a surface of the substrate.

The linker layer may be formed through an Atomic Layer Deposition (ALD) process using a gas containing the linkers.

The linker layer may include one functional group selected from an amine group (—$NH_2$), a carboxyl group (—COOH), and a thiol group (—SH).

The forming of the metal ions may include applying a metal precursor to the linkers.

The forming of the metal ions may include applying a metal precursor solution, where the metal precursor is dissolved, to the linkers, or supplying a gas-phase metal precursor to the linkers.

The energy may be at least one selected from heat energy, chemical energy, light energy, vibration energy, ion beam energy, electron beam energy, and radiation energy.

In another embodiment, a method for fabricating a non-volatile memory device includes: forming a tunneling insulation layer over a substrate; and forming a floating gate for charging and discharging of charges over the tunneling insulation layer, wherein the forming of the floating gate includes: forming dielectric material particle supporters including linkers on the surface of the dielectric material particle supporters over the tunneling insulation layer; forming metal ions over the linker layer; and forming metallic nanoparticles out of the metal ions.

The forming of the dielectric material particle supporters including linkers may include preparing a supporter material by mixing dielectric material particle supporters and linkers with a solvent to form a solution, and coating the substrate with the supporter material or depositing the supporter material on the substrate.

The metallic nanoparticles may be formed through reduction and growth of the metal ions.

The forming of the metallic nanoparticles may include applying energy to the metal ions.

The method may further include supplying an organic surfactant of one or more kinds before or during the application of energy.

The method may further include supplying at least one of an inorganic oxide and/or a dielectric organic material the metallic nanoparticles.

Each of the linkers may include a functional group selected from an amine group (—$NH_2$), a carboxyl group (—COOH), and a thiol group (—SH) to be bonded to a single metal ion.

The forming of the metal ions may include applying a metal precursor to the linkers.

The forming of the metal ions may include applying a metal precursor solution, where the metal precursor is dissolved, to the linkers, or supplying a gas-phase metal precursor to the linkers.

The energy may be at least one selected from heat energy, chemical energy, light energy, vibration energy, ion beam energy, electron beam energy, and radiation energy.

DETAILED DESCRIPTION

Figure 1:
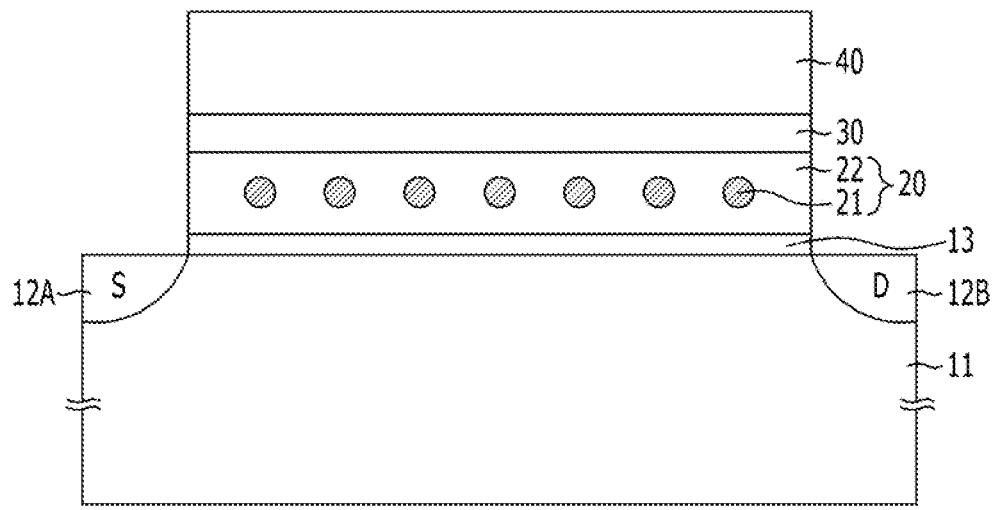
FIG. 1 is a cross-sectional view illustrating a portion of a memory cell structure of a general non-volatile memory device.

Hereinafter, a nano-floating gate memory device including a nano floating gate and a method for fabricating the same according to embodiments of the present disclosure will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In addition, the drawings are not necessarily to scale and, in some instances, proportions may have been exaggerated in order to clearly illustrate features of the embodiments. Throughout the disclosure, reference numerals correspond directly to the like numbered parts in the various figures and embodiments of the present invention.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly over but also over something with an intermediate feature (s) or a layer(s) therebetween. It is also noted that, in this specification, "connected/coupled" refers to one component not only directly coupling another component but also indirectly coupling another component through an intermediate component. In addition, a singular form may include a plural form, and vice versa, as long as it is not specifically mentioned in a sentence.

Unless otherwise mentioned, all terms used herein, including technical or scientific terms, have the same meanings as understood by those skilled in the technical field to which the present disclosure pertains. In this document, a detailed description of known functions and configurations will be omitted when it may obscure the subject matter of the present disclosure.

FIG. 1 is a cross-sectional view illustrating a portion of a memory cell structure of a general non-volatile memory device.

Referring to FIG. 1, a tunneling insulation layer 13, such as a silicon oxide layer, is formed over a silicon substrate 11. A nano floating gate 20 may be formed over the tunneling insulation layer 13. The nano floating gate 20 includes nanoparticles 21 in a single layer (one nanoparticle in thickness) or in multiple layers (multiple nanoparticles in thickness). The nano floating gate 20 may include an insulating material 22 surrounding the nanoparticles 21. A gate insulation layer 30 is formed over the nano floating gate 20 and a control gate 40 is formed over the gate insulation layer 30.

The tunneling insulation layer 13, the nano floating gate 20, the gate insulation layer 30, and the control gate 40 may be patterned over the substrate 11 to form one gate stack. A source 12A and a drain 12B may be formed in the substrate 11 on the sides of the gate stack.

The non-volatile memory device in accordance with an embodiment of the present invention includes an improved nano floating gate. The improved nano floating gate includes nanoparticles that are extremely fine and have uniform sizes in a high density. Hereafter, the features of the structure of the improved nano floating gate and methods for forming the improved nano floating gate are described in detail. However, the improved nano floating gate in accordance with the embodiment of the present invention is not limited to the memory cells of the simple stack structure shown in FIG. 1. In other words, when the technology of the present invention is applied to memory cells of known diverse three-dimensional structures, the position and shape of the nano floating gate may be different and the upper and lower portions of the nano floating gate and the adjacent elements may be different as well. To be specific, the tunneling insulation layer and the source/drain, which are cell elements, may be disposed on the sides of the nano floating gate. The nano floating gate in accordance with the embodiment of the present invention may be applied to a nano floating gate having an element or a material for charging or discharging charges around the nano floating gate.

As the nanoparticles 21 that are not electrically connected to each other store charges in a non-volatile memory device including the nano floating gate 20, the loss of data caused by deterioration of the tunneling insulation layer 13 may be minimized. Also, since the non-volatile memory device including the nano floating gate 20 may have excellent data retention characteristics, it may be scaled down to reduce power consumption and perform program and erase operations through direct tunneling at low voltage and the operation rate of the non-volatile memory device may be improved remarkably.

[Improved Nano Floating Gate and Method for Forming the Same in Accordance with a First Embodiment of the Present Invention]

FIGS. 2A to 2E are cross-sectional views illustrating a method for forming the nano floating gate in accordance with a first embodiment of the present disclosure.

Figure 2A:
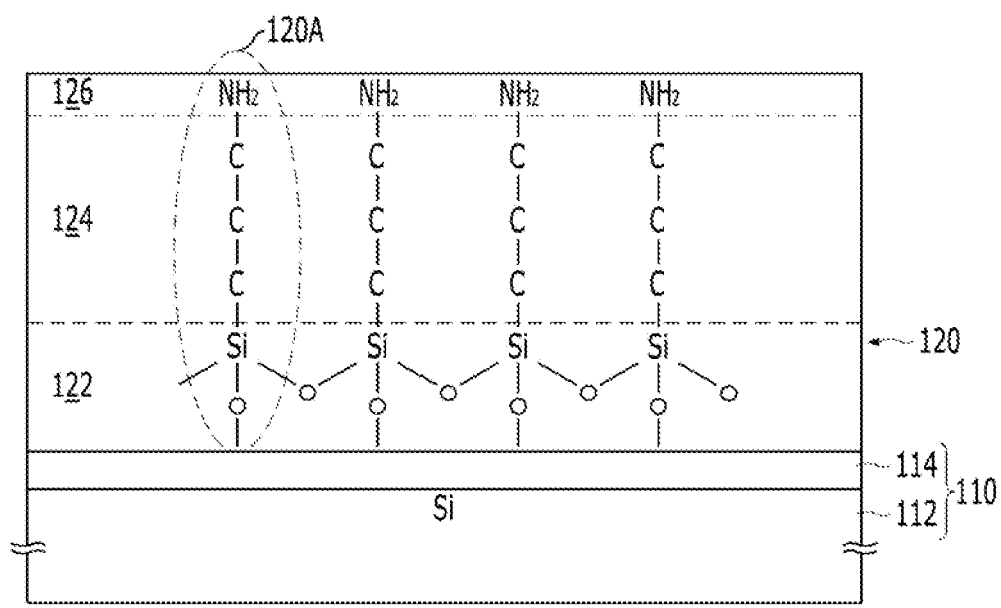
FIGS. 2A to 2E are cross-sectional views illustrating a method for forming a nano floating gate in accordance with a first embodiment of the present disclosure.

In accordance with the first embodiment of the present disclosure, a method for fabricating a non-volatile memory device including a nano floating gate may include bonding linkers 120A to a substrate 110 (see FIG. 2A); bonding metal ions 130 to the linkers 120A (see FIGS. 2B and 2C); and forming the metal ions 130 into metallic nanoparticles 140 by applying energy (see FIG. 2O). Also, the method for fabricating a non-volatile memory device including a nano floating gate may further include supplying a dielectric organic material 150 to the structure including the metallic nanoparticles (see FIG. 2E). Also, the method for fabricating a non-volatile memory device including a nano floating gate may further include supplying organic surfactants of one or more kinds before the energy is applied, or while applying the energy.

FIG. 2A shows the linkers 120A bonded to the prepared substrate 110. Referring to FIG. 2A, the substrate 110 may have a surface layer 114 having a functional group suitable for bonding to linkers. For example, the substrate 110 may be a silicon substrate 112 having a silicon oxide ($SiO_2$) tunneling insulation layer as the surface layer 114.

The substrate 110 may be a semiconductor substrate. The substrate 110 may serve as a physical support to the constituent elements of the memory device, or the substrate 110 may further include a supporting substrate that physically supports the semiconductor substrate. Furthermore, the semiconductor substrate may be used as a raw material for forming constituent elements of the memory device including a channel. Non-limiting examples of the semiconductor substrate that is used as a raw material include formation of a passivation layer through oxidation and/or nitridation of the semiconductor substrate, formation of a source or a drain by doping the semiconductor substrate with an impurity or alloying the semiconductor substrate (e.g., silicidation), and formation of a channel.

The semiconductor substrate may be a wafer, film, or a thin film whose surface is nano-patterned (or structured) in consideration of the physical shape of the designed memory device, which may have a recess structure or a three-dimensional transistor structure.

In terms of physical properties, the substrate 110 may be a rigid substrate or a flexible substrate. Non-limiting examples of flexible substrates include a flexible polymer substrate formed of polyethylene terephthalate (PET), polyethylene naphthalate (PEN), polyimide (PI), polycarbonate (PC), polypropylene (PP), triacetyl cellulose (TAC), polyethersulfone (PES), polydimethylsiloxane (PDMS), or a mixture thereof. When a flexible substrate 110 is used, the surface layer 114 of the substrate may be made of an organic material having a functional group (e.g., an —OH functional group) suitable for bonding to the linkers.

The substrate 110 may include a transparent substrate. Non-limiting examples of transparent substrate include glass substrates and transparent plastic substrates.

The substrate 110 may be an organic semiconductor, an inorganic semiconductor, or a stacked structure thereof.

Non-limiting examples of inorganic semiconductor substrates include a substrate made of a material selected from group 4 semiconductors, which include silicon (Si), germanium (Ge) and silicon germanium (SiGe); group 3-5 semiconductors, which include gallium arsenide (GaAs), indium phosphide (InP) and gallium phosphide (GaP); group 2-6 semiconductors, which include cadmium sulfide (CdS) and zinc telluride (ZnTe); group 4-6 semiconductors, which include lead sulfide (PbS); and a stack of two or more layers made of different materials selected from these materials.

From the perspective of crystallography, the inorganic semiconductor substrate may be a monocrystalline material, a polycrystalline material, an amorphous material, or a mixture of a crystalline material and an amorphous material. When the inorganic semiconductor substrate is a stacked structure, where two or more layers are stacked, each layer may be of a monocrystalline material, a polycrystalline material, an amorphous material, or a mixture of a crystalline material and an amorphous material, independently.

To be specific, the inorganic semiconductor substrate may be a semiconductor substrate including a wafer, such as a silicon (Si) substrate 112, a semiconductor substrate including a wafer where a semiconductor oxide layer is stacked, such as a silicon substrate with a surface oxide layer, or a Silicon On Insulator (SOI) substrate, and a silicon (Si) semiconductor substrate including a metal thin film and a surface oxide layer.

The inorganic semiconductor substrate may be a planar substrate with flat active regions or a structured substrate where active regions protrude. To be specific, the semiconductor substrate may have one or more active regions, where a device is to be formed, with features such as trenches, field oxide (FOX), and/or Local Oxidation of Silicon (LOCOS). The active region, which is defined by typical isolations, may include a channel region, where a channel is formed, and source and drain regions on opposite ends of the channel region.

When the semiconductor substrate is an organic semiconductor substrate, the organic semiconductor of the organic semiconductor substrate may be an n-type organic semiconductor or a p-type organic semiconductor, which are typically used in organic transistors, organic solar cells, and organic light emitting diodes (OLED). Non-limiting examples of organic semiconductors include fulleren-derivatives, such as copper-phthalocyanine (CuPc), poly(3-hexylthiophene) (P3HT), pentacene, subphthalocyanines (SubPc), fulleren (C60), [6,6]-phenyl-C61-butyric acid methyl ester (PCBM) and [6,6]-phenyl C70-butyric acid methyl ester (PC70BM), and tetra uorotetracyanoquinodimethane (F4-TCNQ). However, it should be obvious to those skilled in the art that the type of semiconductor used does not restrict the spirit or concept of the present disclosure.

When the semiconductor substrate is an organic semiconductor substrate, the channel region of the active region may be an organic semiconductor layer, and the source and drain may be formed to confront each other at both ends of the organic semiconductor substrate. The semiconductor substrate may include a supporting substrate disposed in the lower portion of the semiconductor substrate to support the organic semiconductor layer, the source and the drain. The supporting substrate may be a rigid substrate or a flexible substrate.

The semiconductor substrate may be a planar substrate with a planar channel, a structured substrate with two or more vertically staggered planes, or a structured substrate having a protruding pin-shaped channel region, depending on the physical shape of the channel region.

The source and the drain may form an electric field in a direction parallel to the channel, and the length of the channel may be based on the distance between the source and the drain. The distance may be modified according to the design of the memory device. According to an embodiment of the present invention, the distance between the source and the drain may range from about 5 to 200 nm.

The surface layer 114 of the substrate 110 may be formed of any material with functional groups suitable for bonding to the linkers. For example, the surface layer 114 may be a single layer or a stacked layer, where two or more layers of different materials are stacked. If the surface layer 114 is a stacked layer, the layers may have different dielectric constants.

To be specific, the surface layer 114 of the substrate 110 may be a single layer of a material selected from an oxide, a nitride, an oxynitride, and a silicate, or a stacked layer where two or more layers, each of which is listed are stacked. Non-limiting examples of the surface layer 114 of the substrate 110 include a single layer of at least one material selected from a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, a hafnium silicate, a mixture thereof, and a composite thereof, or a stacked layer where two or more layers of listed material are stacked.

Also, the surface layer 114 of the substrate 110 may include an oxide of at least one element selected from metals, transition metals, post-transition metals, and metalloids. Examples of the metals include Li, Na, K, Rb, Cs, Be, Mg, Ca, Sr, and Ba. Examples of the transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, and Au. Examples of the post-transition metals include Al, Ga, In, Sn, Tl, Pb, and Bi. Examples of the metalloids include B, Si, Ge, As, Sb, Te, and Po.

When the surface layer 114 functions as a tunneling insulation layer of a flash memory cell, the surface layer 114 may have a thickness of about 0.1 to 20 nm based on Equivalent Oxide Thickness (EOT). According to another embodiment of the present invention, the surface layer 114 may have a thickness of about 0.8 to 5 nm based on Equivalent Oxide Thickness (EOT). However, the spirit and concept of the present invention are not limited to these measurements.

The surface layer 114 may be formed through a thermal oxidation process, a physical deposition process, or a chemical deposition process. Non-limiting examples of the physical deposition process and the chemical deposition process include sputtering, magnetron-sputtering, e-beam evaporation, thermal evaporation, laser Molecular Beam Epitaxy (L-MBE), a Pulsed Laser Deposition (PLD), vacuum deposition, Atomic Layer Deposition (ALD), and Plasma Enhanced Chemical Vapor Deposition (PECVD), but the spirit and concept of the present disclosure are not limited by the suggested fabrication processes.

A linker layer 120 may be formed on the substrate 110. The linker layer 120 may be composed of linkers 120A. The linker layer 120 may be a self-assembled monomolecular layer bonded to the surface of the substrate 110.

The linkers 120A may be organic linkers that are chemically bonded to or adsorbed on the surface of the substrate 110 and may chemically bond with metal ions 130. Specifically, the linkers 120A may be organic linkers having both a functional group 122 that is chemically bonded to or adsorbed on the surface layer 114 of the substrate and a functional group 126 that is chemically bonded to metal ions 130 (to be formed later). The chemical bond may include a covalent bond, an ionic bond, or a coordination bond. For example, the bond between metal ions 130 and the linkers may be an ionic bond between positively charged (or negatively charged) metal ions 130 and linkers that are negatively charged (or positively charged), at least at one end. For example, the bond between the surface layer 114 of the substrate 110 and the linkers may be a bond formed by self-assembly or may be a spontaneous chemical bond between the functional group 122 of the linkers and the surface of the substrate.

More specifically, the linkers 120A may be organic molecules that form a self-assembled monomolecular layer. In other words, the linkers 120A may be organic molecules having both a functional group 122 that is bonded to the surface layer 114 and a functional group 126 suitable for bonding with metal ions 130. The linkers 120A may also include a chain group 124, which connects the functional group 122 bonded to the surface layer 114 with the functional group 126 suitable for bonding with metal ions. The chain group 124 may assist in enabling the formation of a monomolecular layer aligned by Van Der Waals interactions.

Self-assembly may be achieved by suitably designing the substrate surface 114 and the first functional groups 122 of the linkers 120A. A set of end groups that are generally known to be self-assembling may be used.

In a specific non-limiting embodiment, when the surface layer 114 of the substrate 110 is made of oxide, nitride, oxynitride, or silicate, the organic molecule that is the linker 120A may be a compound represented by the following Formula 1.

(Formula 1)

In Formula 1, R1 represents a functional group 122 that bonds with the substrate 110, C represents a chain group 124, and R2 represents a functional group 126 that bonds with metal ions 130. R1 may be one or more functional groups selected from acetyl, acetic acid, phosphine, phosphonic acid, alcohol, vinyl, amide, phenyl, amine, acryl, silane, cyan and thiol groups. C may be a linear or branched carbon chain having 1 to 20 carbon atoms. R2 may be one or more functional groups selected from carboxylic acid, carboxyl, amine, phosphine, phosphonic acid and thiol groups.

In a non-limiting embodiment, the organic molecule that is the linker 120A may be one or more selected from among octyltrichlorosilane (OTS), hexamethyldisilazane (HMDS), octadecyltrichlorosilane (ODTS), (3-aminopropyl)trimethoxysilane (APS), (3-aminopropyl)triethoxysilane, N-(3-aminopropyl)-dimethyl-ethoxysilane (APDMES), perfluorodecyltrichlorosilane (PFS), mercaptopropyltrimethoxysilane (MPTMS), N-(2-aminoethyl)-3aminopropyl-trymethoxysilane, (3-trimethoxysilylpropyl)diethylenetriamine, octadecyltrimethoxysilane (OTMS), (heptadecafluoro-1,1,2,2-tetrahydrodecyl)trichlorosilane (FDTS), dichlorodimethylsilane (DDMS), N-(trimethoxysilylpropyl)ethylenediamine triacetic acid, hexadecanethiol (HDT), and epoxyhexyltriethoxysilan.

To ensure stable isolation between the nanoparticles 140 and the substrate 110, the organic molecule that is the linker 120A may include an alkane chain group 124, particularly an alkane chain group having 3 to 20 carbon atoms, and may further include an oxygen-containing moiety. Examples of the oxygen-containing moiety include ethylene glycol (—O—CH$_2$—CH$_2$—), carboxylic acid (—COOH), alcohol (—OH), ether (—O—), ester (—COO—), ketone (—CO—), aldehyde (—COH) and/or amide (—NH—CO—), etc.

Attachment of the linkers 120A may be performed by bringing the substrate 110 into contact with a solution of linkers 120A in a solvent. The solvent that is used to form the linker solution may be any solvent that may dissolve the linkers and be removed by volatilization. As is known in the art, when the linker contains a silane group, water for promoting hydrolysis may be added to the linker solution. It is to be understood that the contact between the substrate 110 and the linker solution may be performed using any method suitable for forming a self-assembled monomolecular layer on a substrate. In a non-limiting embodiment, the contact between the linker solution and the substrate may be performed using a dipping, micro contact printing, spin-coating, roll coating, screen coating, spray coating, spin casting, flow coating, screen printing, ink jet coating or drop casting method.

When metal ions 130 are fixed to the substrate 110 by the linkers 120A, there are advantages in that damage to the surface layer 114 of the substrate may be prevented and a metal ion layer having uniformly distributed metal ions 130 may be formed by self-assembly. Also, nanoparticles 140 prepared by application of energy may be stably fixed.

The linkers 120A may have functional groups 126 that chemically bond with metal ions 130. The substrate surface 114 may be modified to attach a functional group (of the linkers), and then a metal precursor may be supplied to the surface-modified substrate so that metal ions 130 may bond with the functional groups 126. The functional groups 126 may be one or more selected from carboxylic acid, carboxyl, amine, phosphine, phosphonic acid and thiol groups. Formation of the functional groups 126 on the substrate surface 114 may be performed using any method. Specific examples of methods for forming the functional groups 126 on the substrate surface 114 include plasma modification, chemical modification, and vapor deposition (application) of a compound having a functional group. Modification of the substrate surface 114 may be performed by vapor deposition (application of a compound having a functional group) to prevent the introduction of surface layer impurities, quality deterioration, and damage.

In a specific non-limiting embodiment, when the surface layer 114 of the substrate 110 is formed of an oxide, a nitride, an oxynitride or a silicate, a functional group (linker) may be formed by a silane compound layer on the substrate 110.

The silane compound layer (linker layer) may be made of an alkoxy silane compound having one or more functional groups selected from among carboxylic acid, carboxyl, amine, phosphine, phosphonic acid and thiol groups.

The silane compound may be represented by the following Formula 2:

$$R^1{}_n(R^2O)_{3-n}Si-R \quad \text{(Formula 2)}$$

In Formula 2, $R^1$ is hydrogen, a carboxylic acid group, a carboxyl group, an amine group, a phosphine group, a phosphonic acid group, a thiol group, or a linear or branched alkyl group having 1 to 10 carbon atoms; $R^2$ is a linear or branched alkyl group having 1 to 10 carbon atoms; R is a linear or branched alkyl group having 1 to 10 carbon atoms; the alkyl group in R may be substituted with one or more selected from among carboxylic acid, carboxyl, amine, phosphine, phosphonic acid and thiol groups; the alkyl group in $R^1$ and the alkyl group in $R^2$ may each be independently substituted with one or more selected from among halogen, carboxylic acid, carboxyl, amine, phosphine, phosphonic acid and thiol groups; and n is 0, 1 or 2.

The silane compound may also be represented by one of the following Formulas 3 to 5:

$$(R^3)_3Si-R^4-SH \quad \text{(Formula 3)}$$

$$(R^3)_3Si-R^4-COOH \quad \text{(Formula 4)}$$

$$(R^3)_3Si-R^4-NH_2 \quad \text{(Formula 5)}$$

In the Formulas 3, 4, and 5, $R^3$ groups are each independently an alkoxy or alkyl group, and one or more $R^3$ groups are an alkoxy group; and $R^4$ is a divalent hydrocarbon group having 1 to 20 carbon atoms. $R^3$ groups in Formula 3, 4 or 5 may be the same or different and may each be independently an alkoxy group, such as methoxy, ethoxy or propoxy, or an alkyl group; and $R^4$ may be a divalent hydrocarbon group having 1 to 20 carbon atoms, such as $-CH_2-$, $-CH_2-CH_2-$, $-CH_2-CH_2-CH_2-$, $-CH_2-CH(CH_3)-CH_2-$ or $-CH_2-CH_2-CH(CH_3)-$.

Non-limiting examples of the carboxysilane compound include methyldiacetoxysilane, 1,3-dimethyl-1,3-diacetoxydisiloxane, 1,2-dimethyl-1,2-diacetoxydisilane, 1,3-dimethyl-1,3-dipropionoxydisilamethane, and 1,3-diethyl-1,3-diacetoxydisilamethane. Non-limiting examples of the aminosilane compound include N-(2-aminoethyl)aminopropyltri(methoxy)silane, N-(2-aminoethyl)aminopropyltri(ethoxy)silane, N-(2-aminoethyl)aminopropylmethyldi(methoxy)silane, N-(2-aminoethyl)aminopropylmethyldi(ethoxy)silane, 3-aminopropyl tri(methoxy)silane, 3-aminopropyltri(ethoxy)silane, 3-aminopropylmethyldi(methoxy)silane, and 3-aminopropylmethyldi(ethoxy)silane. Non-limiting examples of the mercaptosilane compound include mercaptopropyltrimethoxysilane, mercaptopropyl triethoxysilane, mercaptoethyltrimethoxysilane, and mercaptoethyltriethoxysilane.

The above-described silane compound may be applied to or deposited on the surface of the substrate 110 to form a functional group (a functional group resulting from a silane compound layer). The silane compound layer may be formed by applying and drying a silane compound solution. Alternatively, the silane compound may be deposited by supplying a gaseous silane compound to the substrate surface.

As the silane compound functional group will react with a metal precursor to be supplied later to fix metal ions to the substrate, it is preferred to form the silane compound layer as a uniform layer where the functional groups are uniformly exposed to the surface. The silane compound layer may be formed by atomic layer deposition (ALD).

The above-described silane compounds having a functional group (particularly the silane compound of Formulas 2, 3, and 4) may belong to the above-described self-assembly molecule group. Specifically, $(R^3)_3Si$ may correspond to the functional group that is bonded to the substrate surface, $R^4$ may correspond to the chain group, and R (R in formula 2) such as $-SH$, $-COOH$ or $-NH_2$ may correspond to the functional group that bonds with metal ions. The silane compound layer may be a monomolecular layer formed of the silane compound.

Figure 2B:
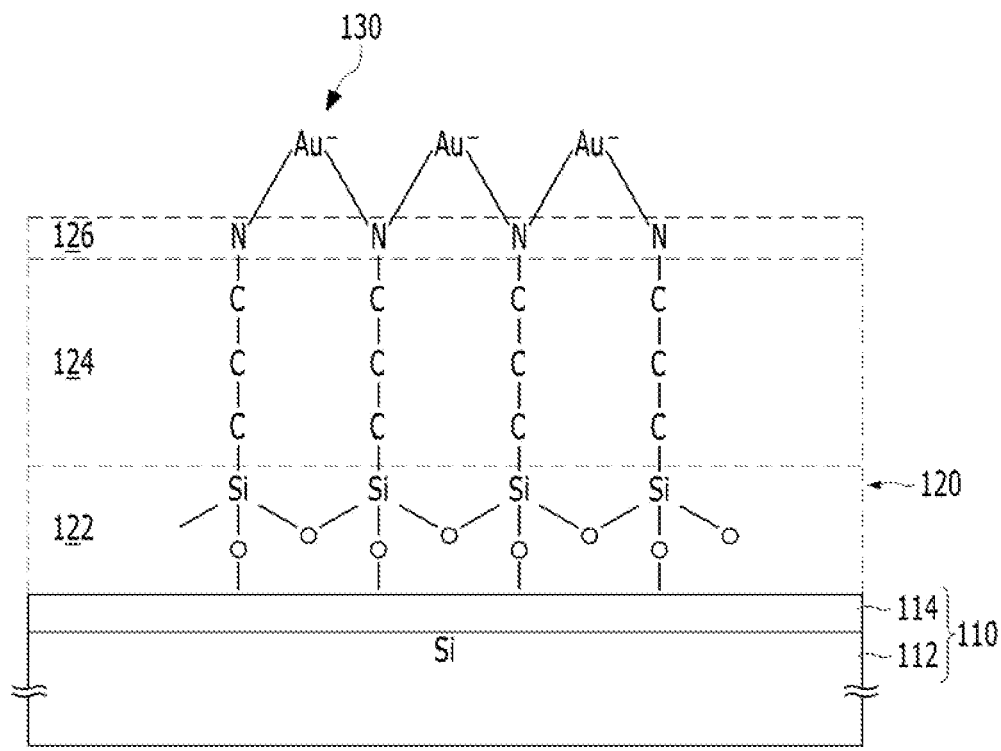
Figure 2C:
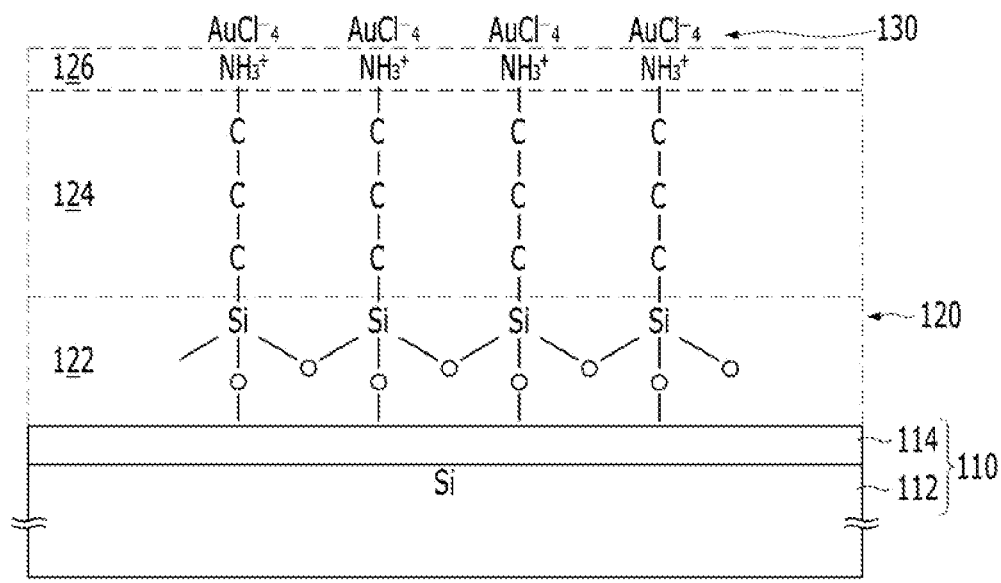

FIGS. 2B and 2C show metal ions 130 bonded to the linkers 120A. The metal ions 130 may be bonded to the functional group 126 of the linkers 120A.

The metal ions 130 may be formed by supplying a metal precursor to the substrate (having the linkers formed thereon). Specifically, the metal ions 130 may be formed by applying (or impregnating) a metal precursor solution to the substrate or applying a gaseous metal precursor to the substrate.

The metal precursor may be designed in view of the material of the desired nanoparticles. For example, the metal precursor may be one or more metals selected from among transition metals, post-transition metals, and metalloids. In a non-limiting embodiment, the transition metal precursor may be a transition metal salt. Specifically, the transition metal may be one or more selected from among Au, Ag, Ru, Pd and Pt, and the transition metal salt may be selected from among halides, chalcogenides, hydrochlorides, nitrates, sulfates, acetates or ammonium salts of the transition metal. When the transition metal of the transition metal precursor is Au, examples of the transition metal precursor include, but are not limited to, $HAuCl_4$, $AuCl$, $AuCl_3$, $Au_4Cl_6$, $KAuCl_4$, $NaAuCl_4$, $NaAuBr_4$, $AuBr_3$, $AuBr$, $AuF_3$, $AuF_5$, $AuI$, $AuI_3$, $KAu(CN)_2$, $Au_2O_3$, $Au_2S$, $Au_2S_3$, $AuSe$, $Au_2Se_3$, and the like.

The metal ions 130 that are bonded (attached) to the substrate by the linkers 120A may be ions of one or more metals (or elements) selected from among transition metals, post-transition metals, and metalloids. Depending on the kind of metal precursor, the metal ions 130 may be the above-described metal ions themselves or ions including the above-described metals. Metal ions themselves may be bonded to the functional groups 126 of the organic molecules (linkers) (see FIG. 2B), or metal-containing ions may be bonded to the second functional groups 126 of organic molecules (see FIG. 2C). Metal-containing ions may originate from a reaction between the metal precursor and the functional groups of the organic molecules.

Figure 2D:
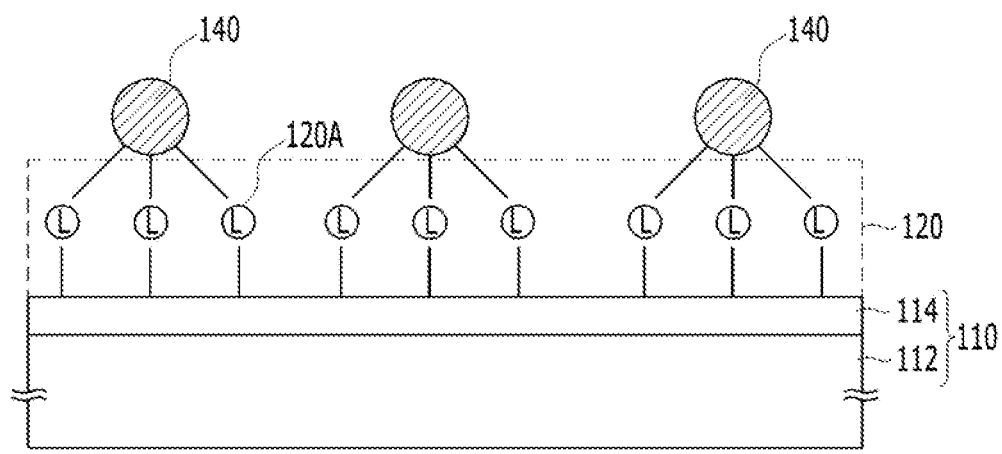

FIG. 2D shows metallic nanoparticles 140 formed by the reduction and growth of the metal ions 130 by application of energy. The metallic nanoparticles 140 may be attached to the substrate 110 by the linkers 120A.

Advanced technology enables the synthesis of very fine nanoparticles of several tens to several hundreds of atoms, but in view of thermodynamics, synthesized nanoparticles may not have a uniform particle size distribution and the size difference between the nanoparticles may increase as the size of the reaction field during synthesis increases. A method of preparing nanoparticles by etching using a top-down process enables the preparation of particles having sizes of 20 nm or less by advanced lithography, but it is difficult to apply commercially because the process is complicated and precise control is required.

However, in a preparation method according to an embodiment of the present disclosure, nanoparticles are prepared directly in a very small reaction field corresponding to the surface region of the substrate, and thus nanoparticles having a very uniform and finely controlled size may be prepared at high density. Because nanoparticles are prepared by fixing metal ions to the substrate by the linkers and then applying energy to the metal ions, the nanoparticles may be produced within a short time in a simple, easy and cost-effective manner. Further, because nucleation and growth (formation of nanoparticles) are induced by application of energy in a state where metal atoms (ions) are fixed to the substrate by the linkers, the transfer of the metal atoms (ions) may be uniformly controlled resulting in the formation of more uniform and fine nanoparticles. A metal material to be used for nucleation and growth to form nanoparticles may be supplied solely by the metal atoms (ions) bonded to the linkers. In other words, the supply of a material used to form nanoparticles comes from the diffusion of the metal atoms (ions) bonded to the linkers. Due to bonding of the metal atoms 140 (ions 130) to the linkers, the metal atoms (ions) have difficulty moving beyond a predetermined distance to participate in nucleation and growth, and thus the reaction field of each nanoparticle may be limited to around the nucleus. Thus, nanoparticles having a more uniform and finer size may be formed on the substrate at high density and the separation distance between the formed nanoparticles may also be uniform. In addition, bonding of the metallic nanoparticles to the linkers is maintained, and thus the nanoparticles may be stably fixed to the substrate by the linkers. Also, the separation distance between the nanoparticles may correspond to the diffusion distance of the metal atoms that participate in the nucleation and growth of the nanoparticles.

Energy that is applied to form the nanoparticles 140 may be one or more selected from among heat energy, chemical energy, light energy, vibration energy, ion beam energy, electron beam energy, and radiation energy.

Thermal energy may include Joule heat. Thermal energy may be applied directly or indirectly. Direct application of thermal energy may be performed in a state in which a heat source and the substrate having metal ions fixed thereto come into physical contact with each other. Indirect application of thermal energy may be performed in a state in which a heat source and the substrate having metal ions fixed thereto do not come into physical contact with each other. Non-limiting examples of direct application include a method of placing a heating element, which generates Joule heat by the flow of electric current, beneath the substrate and transferring thermal energy to the metal ions through the substrate. Non-limiting examples of indirect application include a method that uses a conventional heat-treatment furnace including a space in which an object (such as a tube) to be heat-treated is placed, a heat insulation material that surrounds the space to prevent heat loss, and a heating element placed inside the heat insulation material. A non-limiting example of indirect heat application is seen in the method of placing a heating element at a predetermined distance above the substrate, where the metal ions are fixed, and transferring thermal energy to the metal ions through a fluid (including air) present between the substrate and the heating element.

Light energy may include light having a wavelength ranging from extreme ultraviolet to near-infrared, and application of light energy may include irradiation with light. In a non-limiting embodiment, a light source may be placed above the substrate, having the metal ions fixed thereto, at a predetermined distance from the metal ions, and light from the light source may be irradiated onto the metal ions.

Vibration energy may include microwaves and/or ultrasonic waves. Application of vibration energy may include irradiation with microwaves and/or ultrasonic waves. In a non-limiting embodiment, a microwave and/or ultrasonic wave source may be placed above the substrate, having the metal ions fixed thereto, at a predetermined distance from the metal ions, and microwaves and/or ultrasonic waves from the source may be irradiated onto the metal ions.

Radiation energy may include one or more selected from among $\alpha$ rays, $\beta$ rays and $\gamma$ rays. In a non-limiting embodiment, a radiation source may be placed above the substrate, having the metal ions fixed thereto, at a predetermined distance from the metal ions, and radiation from the source may be irradiated onto the metal ions.

The energy applied may be the kinetic energy of a particle beam, and the particle beam may include an ion beam and/or an electron beam. The ions of the beam may be negatively charged. In a non-limiting embodiment, an ion or electron source may be placed above the substrate, having the metal ions fixed thereto, at a predetermined distance from the metal ions, and an ion beam and/or electron beam may be applied to the metal ions using an accelerating element that provides an electric field (magnetic field) that accelerates ions or electrons in the direction of the metal ions.

Chemical energy is the Gibbs free energy difference between before and after a chemical reaction, and the chemical energy may include reduction energy. Chemical energy may include the energy of a reduction reaction with a reducing agent and may mean the energy of a reduction reaction in which the metal ions are reduced by the reducing agent. In a non-limiting embodiment, application of chemical energy may be a reduction reaction in which the reducing agent is brought into contact with the substrate having the metal ions fixed thereto. The reducing agent may be supplied in the liquid or gaseous state.

In a fabrication method according to an embodiment of present disclosure, application of energy may include simultaneously or sequentially applying two or more selected from among heat energy, chemical energy, light energy, vibration energy, ion beam energy, electron beam energy, and radiation energy.

In a specific embodiment of simultaneous application, application of heat may be performed simultaneously with application of a particle beam. It is to be understood that the particles of the particle beam may be heated by heat energy. In another specific embodiment of simultaneous application, application of heat may be performed simultaneously with application of a reducing agent. In still another embodiment of simultaneous application, application of a particle beam may be performed simultaneously with application of infrared rays or with application of microwaves.

Sequential application may mean that one kind of energy is applied followed by application of another kind of energy. It may also mean that different kinds of energy are continuously or discontinuously applied to the metal ions. It is preferable that reduction of the metal ions 130 fixed to the substrate 110 by the linkers 120A be performed before formation of nanoparticles 140, and thus in a specific embodiment of sequential application, heat may be applied after addition of a reducing agent or after application of a positively charged particle beam.

In a non-limiting practical embodiment, application of energy may be performed using a rapid thermal processing (RTP) system including a tungsten-halogen lamp and the rapid thermal processing may be performed at a heating rate of 50 to 150° C./sec. Also, rapid thermal processing may be performed in a reducing atmosphere or an inert gas atmosphere.

In a non-limiting practical embodiment, application of energy may be performed by bringing a solution of a reducing agent in a solvent into contact with the metal ions followed by thermal processing using a rapid thermal processing system in a reducing atmosphere or an inert gas atmosphere.

In a non-limiting practical embodiment, application of energy may be performed by generating an electron beam from an electron beam generator in a vacuum chamber and accelerating the generated electron beam to the metal ions. The electron beam generator may be a square type or a linear gun type. The electron beam may be produced by generating plasma from the electron beam generator and extracting electrons from the plasma using a shielding membrane. In addition, it is to be understood that a heating element may be provided on a holder for supporting the substrate in the vacuum chamber, and heat energy may be applied to the substrate by this heating element before, during and/or after application of the electron beam.

When the desired nanoparticles are metal nanoparticles, the metal nanoparticles may be prepared in situ by application of energy as described above. When the nanoparticles to be prepared are not metal nanoparticles, but are metal compound nanoparticles, the metal compound nanoparticles may be prepared by supplying an element different from the metal ions during or after application of the above-described energy. Specifically, the metal compound nanoparticles may include metal oxide nanoparticles, metal nitride nanoparticles, metal carbide nanoparticles or intermetallic compound nanoparticles. More specifically, the metal compound nanoparticles may be prepared by supplying a different substance in the gaseous or liquid state during or after application of the above-described energy. In a specific embodiment, metal oxide nanoparticles in place of metal nanoparticles may be prepared by supplying an oxygen source including oxygen gas during application of energy. In addition, metal nitride nanoparticles in place of metal nanoparticles may be prepared by supplying a nitrogen source including nitrogen gas during application of energy. Metal carbide nanoparticles may be prepared by supplying a carbon source, including $C_1$-$C_{10}$ hydrocarbon gas during application of energy, and intermetallic compound nanoparticles may be prepared by supplying a precursor gas containing a different substance (e.g. elements, compounds, or mixtures), which provides an intermetallic compound, during application of energy. Specifically, the intermetallic compound nanoparticles may be prepared by carbonizing, oxidizing, nitrifying or alloying the metal nanoparticles prepared by application of the above-described energy.

The density of nanoparticles (the number of nanoparticles per unit surface area of the channel region) and the particle size and particle size distribution may be controlled by the energy application conditions, including the kind, magnitude, temperature, and duration of the energy applied.

To be specific, nanoparticles having an average particle diameter of about 0.5 to 3 nm may be fabricated by applying energy. In this case, uniform nanoparticles may be prepared with a particle radius standard deviation of about ±20% or less, and highly dense nanoparticles having a nanoparticle density (which is the number of the nanoparticles per unit area) of about $10^{13}$ to $10^{15}$/cm$^2$ may be prepared.

According to an embodiment, when the applied energy is an electron beam, the electron beam may be irradiated at a dose of about 0.1 KGy to 100 KGy. With this electron beam irradiation dose, nanoparticles having an average particle diameter of about 2 to 3 nm may be prepared, and the nanoparticles may have a particle radius standard deviation of about ±20% or less. The nanoparticle density (which is the number of the nanoparticles per unit area) may range from about $10^{13}$ to $10^{15}$/cm$^2$.

According to another embodiment, when the applied energy is an electron beam, the electron beam may be irradiated at a dose of about 100 µGy to 50 KGy. With this electron beam irradiation dose, nanoparticles having an average particle diameter of about 1.3 to 1.9 nm may be prepared, and the nanoparticles may have a particle radius standard deviation of about ±20% or less. The nanoparticle density (which is the number of the nanoparticles per unit area) may range from about $10^{13}$ to $10^{15}$/cm$^2$, and specifically, the nanoparticle density may range from about $0.2 \times 10^{14}$ to $0.2 \times 10^{15}$/cm$^2$.

According to another embodiment, when the applied energy is an electron beam, the electron beam may be irradiated at a dose of about 1 µGy to 10 KGy. With this electron beam irradiation dose, nanoparticles having an average particle diameter of about 0.5 to 1.2 nm may be prepared, and the nanoparticles may have a particle radius standard deviation of about ±20% or less. The nanoparticle density (which is the number of the nanoparticles per unit area) may range from about $10^{13}$ to $10^{15}$/cm$^2$, and specifically, the nanoparticle density may range from about $0.2 \times 10^{14}$ to $0.3 \times 10^{15}$/cm$^2$.

According to another embodiment, when the applied energy is heat energy, nanoparticles having an average particle diameter of about 2 to 3 nm may be prepared by performing a heat treatment in a reducing atmosphere at a temperature of about 100 to 500° C. for about 0.5 to 2 hours or by supplying a reducing agent to the metal ions bonded to the linkers and performing a heat treatment in an inert gas atmosphere at a temperature of about 200 to 400° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}$/cm$^2$.

According to another embodiment, when the applied energy is heat energy, nanoparticles having an average particle diameter of about 1.3 to 1.9 nm may be prepared by performing a heat treatment in a reducing atmosphere at a temperature of about 200 to 400° C. for about 0.5 to 2 hours or by supplying a reducing agent to the metal ions bonded to the linkers and performing a heat treatment in an inert gas atmosphere at a temperature of about 100 to 300° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}$/cm$^2$, and specifically, the nanoparticle density may range from about $0.2 \times 10^{14}$ to $0.2 \times 10^{15}$/cm$^2$.

According to another embodiment, when the applied energy is heat energy, nanoparticles having an average particle diameter of about 0.5 to 1.2 nm may be prepared by performing a heat treatment in a reducing atmosphere at a temperature of about 200 to 400° C. for about 0.2 to 1 hour or by supplying a reducing agent to the metal ions 130 bonded to the linkers 120A and performing a heat treatment in an inert gas atmosphere at a temperature of about 100 to 300° C. for about 0.2 to 1 hour. The prepared nanoparticles may have a particle radius standard deviation of about ±20% or less. The nanoparticle density (which is the number of the nanoparticles per unit area) may range from about $10^{13}$ to $10^{15}$/cm$^2$, and specifically, the nanoparticle density may range from about $0.2 \times 10^{14}$ to $0.3 \times 10^{15}$/cm$^2$.

According to another embodiment, when the applied energy is chemical energy, nanoparticles having an average particle diameter of about 2 to 3 nm may be prepared by performing a chemical reaction induced by a reducing agent at a reaction temperature of about 20 to 40° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}/cm^2$.

According to another embodiment, when the applied energy is chemical energy, nanoparticles having an average particle diameter of about 1.3 to 1.9 nm may be prepared by performing a chemical reaction induced by a reducing agent at a reaction temperature of about −25 to 5° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}/cm^2$, and specifically, the nanoparticle density may range from about $0.2 \times 10^{14}$ to $0.2 \times 10^{15}/cm^2$.

According to another embodiment, when the applied energy is chemical energy, nanoparticles having an average particle diameter of about 0.5 to 1.2 nm may be prepared by performing a chemical reaction induced by a reducing agent at a reaction temperature of about −25 to 5° C. for about 0.2 to 1 hours. The prepared nanoparticles may have a particle radius standard deviation of about ±20% or less. The nanoparticle density (which is the number of the nanoparticles per unit area) may range from about $10^{13}$ to $10^{15}/cm^2$, and specifically, the nanoparticle density may range from about $0.2 \times 10^{14}$ to $0.3 \times 10^{15}/cm^2$.

As described above, when heat energy is applied, there are three suggested options: applying heat energy in a reducing atmosphere; sequentially applying chemical energy and heat energy; or applying chemical energy with heat energy. When heat energy is applied in a reducing atmosphere, the reducing atmosphere may contain hydrogen. In a specific embodiment, the reducing atmosphere may be an inert gas containing about 1 to 5% hydrogen. To provide for uniform reduction, heat energy may be applied in an atmosphere in which a reducing gas flows. In a specific embodiment, the atmosphere may have reducing gas flowing at a flow rate of about 10 to 100 cc/min. When chemical energy and heat energy are sequentially applied, a reducing agent may be brought into contact with the metal ions 130 bonded to the linkers 120A, followed by application of heat energy in an inert atmosphere. The reducing agent may be any compound that reduces the metal ions into a metal. When chemical energy is applied by addition of the reducing agent, nanoparticles 140 may also be formed by a reduction reaction. When nanoparticles are formed from the metal ions by a reduction reaction, the reduction reaction should occur rapidly and uniformly throughout the channel region to increase the uniformity of the metal nanoparticles 140. A strong reducing agent may be used, and in a preferred embodiment, the reducing agent may be $NaBH_4$, $KBH_4$, $N_2H_4H_2O$, $N_2H_4$, $LiAlH_4$, HCHO, $CH_3CHO$, or a mixture of two or more thereof. Also, when chemical energy is applied, the size of the nanoparticles may be controlled by adjusting the chemical reaction temperature and controlling the nucleation rate and the growth of the nanoparticles when a strong reducing agent, as described above, is used. The contact between the metal ions bonded to the linkers and the reducing agent may be achieved by applying a reducing agent solution to the metal ion bonded region, or by impregnating the substrate with a reducing agent solution, or by supplying a reducing agent in the gaseous phase to the substrate. In a specific non-limiting embodiment, the contact between the reducing agent and the metal ions may be performed at room temperature for about 1 to 12 hours.

As described above, the nucleation and growth of transition metal nanoparticles may be controlled by one or more factors selected from the kind, magnitude, and time of the applied energy.

With the methods disclosed in this application, it is possible to prepare not only metallic nanoparticles but also metal oxide nanoparticles, metal nitride nanoparticles, metal carbide nanoparticles, or intermetallic compound nanoparticles by supplying a heterogeneous atom source while energy is applied or after energy is applied to transform metallic nanoparticles into metallic compound nanoparticles.

In a fabrication method according to an embodiment of the present disclosure, the size of nanoparticles may be controlled by supplying an organic surfactant that bonds to or is adsorbed on the metal ions, followed by application of energy. Otherwise, the size of nanoparticles may be controlled by supplying an organic surfactant that bonds to or is adsorbed on the metal ions or the nanoparticles that are being grown during the application of energy. This supply of the organic surfactant may be optionally performed during the fabrication process. Instead of a single organic surfactant being applied before or during the application of energy, multiple organic surfactants may be used.

To more effectively inhibit the mass transfer of the metal ions, a first organic material and a second organic material, which are different from each other, may be used as the surfactant.

The first organic material may be a nitrogen- or sulfur-containing organic compound. For example, the sulfur-containing organic material may include a linear or branched hydrocarbon compound having a thiol group at one end. In a specific example, the sulfur-containing organic compound may be one or more selected from among HS—$C_n$—$CH_3$ (n: an integer ranging from 2 to 20), n-dodecyl mercaptan, methyl mercaptan, ethyl mercaptan, butyl mercaptan, ethylhexyl mercaptan, isooctyl mercaptan, tert-dodecyl mercaptan, thioglycolacetic acid, mercaptopropionic acid, mercaptoethanol, mercaptopropanol, mercaptobutanol, mercaptohexanol and octyl thioglycolate.

The second organic material may be a phase-transfer catalyst-based organic compound, for example, quaternary ammonium or a phosphonium salt. More specifically, the second organic surfactant may be one or more selected from among tetraocylyammonium bromide, tetramethylammonium, tetra-n-butylammonium bromide, tetramethylammonium chloride, and tetrabutylammonium fluoride.

The organic surfactant that is applied before or during application of energy may be bonded to or adsorbed on the nuclei of metal ions, and the nucleation and growth of nanoparticles by the energy applied may be controlled by the organic surfactant(s) that are bonded to or adsorbed on the metal ions. The organic surfactant(s) inhibit the mass transfer of the metal ions during the application of energy to thereby form more uniform and finer nanoparticles. Because the metal ions bond with the organic surfactant, the metal ions then require higher activation energy to diffuse, compared to when they would otherwise diffuse without surfactant present, and participate in nucleation or growth. In other words, the diffusion of the metal ions and/or nanoparticles is physically inhibited by the organic surfactant(s). Thus, the diffusion of the metal atoms (ions) may be reduced and the number of the metal atoms (ions) that participate in the growth of each nanoparticle may decrease.

The process of applying energy in the presence of the organic surfactant may include, before application of energy, applying a solution of the organic surfactant to the channel region (i.e., the substrate surface having the metal ions bonded thereto by the linkers) or supplying the organic surfactant in the gaseous state to the channel region. Alternatively, it may include, together with application of energy, applying a solution of the organic surfactant to the channel region having the metal ions formed therein or supplying the organic material in the gaseous state to the channel region to bond or adsorb the organic surfactant to the metal nuclei. Alternatively, it may include, during application of energy, applying a solution of the organic surfactant to the channel region having the metal ions formed therein or supplying the organic material in the gaseous state to the channel region to bond or adsorb the organic surfactant to the metal nuclei. Alternatively, it may include, after application of energy for a predetermined period of time, while pausing the application of energy, applying a solution of the organic surfactant to the channel region having the metal, ions formed therein or supplying the organic material in the gaseous state to the channel region to bond or adsorb the organic surfactant to the metal nuclei, followed by re-application of energy.

In a fabrication method according to an embodiment of the present disclosure, energy may be applied to the entire area or a portion of the region where the metal ions are bonded. When energy is applied to a portion of the region, energy may be irradiated in a spot, line or predetermined plane shape. In a non-limiting embodiment, energy may be applied (irradiated) in spots while the entire metal ion-bonded region is scanned. Application of energy to a portion of the metal ion-bonded region may include irradiating energy in a spot, line or plane shape while the entire metal ion-bonded region is scanned, thereby applying (irradiating) energy to only a portion of the metal ion-bonded region. As described above, a pattern of nanoparticles may be formed by applying energy to a portion of the channel region. In other words, application (irradiation) of energy to a portion of the channel region makes it possible to form nanoparticle patterns.

Figure 2E:
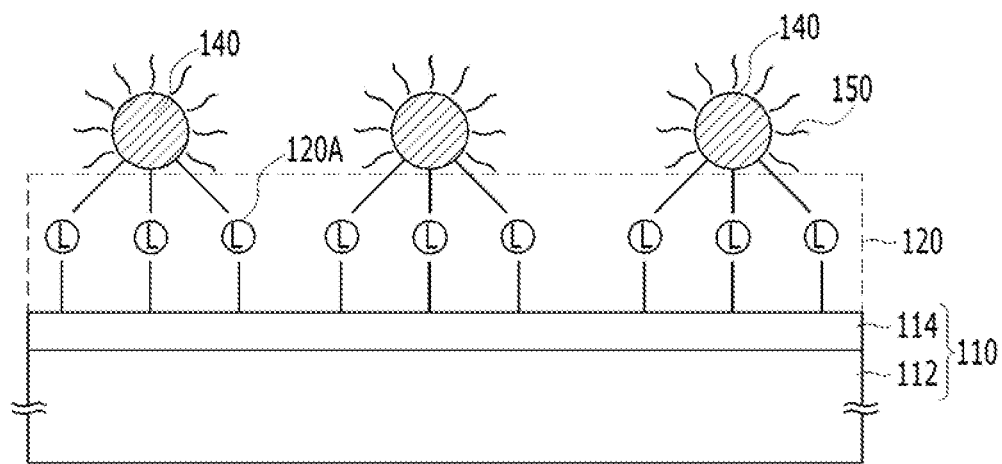

FIG. 2E shows a dielectric organic material 150 bonded to the metallic nanoparticles 140 grown by application of energy. The dielectric organic material 150 may coat the surface of the metallic nanoparticles 140 or fill the gaps between the metallic nanoparticles 140. The dielectric organic material 150 may isolate the nanoparticles to prevent the flow of current between nanoparticles.

If a sufficient amount of the organic surfactant was supplied in the preceding action, that is, if the organic surfactant that is applied before or during application of energy remains on the surface of the grown nanoparticles to provide sufficient isolation between the grown nanoparticles, the dielectric organic material 150 does not need to be added to the surface of the grown nanoparticles 140. In other words, because whether the organic surfactant is to be used (or the amount and kind of the organic surfactant to be supplied) depends on the desired nanoparticle size, the formation of the dielectric organic material 150 is optional.

Supply of the dielectric organic material 150 may be performed by applying a solution of the dielectric organic material to the nanoparticle layer, formed by application of energy, and then drying the applied solution, thereby filling the dielectric organic material into the gaps between the nanoparticles. This may provide a structure in which the nanoparticles are embedded in a dielectric matrix made of the dielectric organic material. The dielectric organic material that is used in the present disclosure may be any conventional dielectric material that is used to form dielectric layers in conventional organic-based electronic devices. Specific examples of the dielectric organic material include, but are not limited to, benzocyclobutene (BCB), acrylic compounds, polyimide, polymethylmethacrylate (PMMA), polypropylene, fluorinated compounds (e.g., CYTOPTM), polyvinyl alcohol, polyvinyl phenol, polyethylene terephthalate, poly-p-xylylene, cyanopulluane (CYMM) and polymethylstyrene.

The dielectric organic material 150 may be a substance that spontaneously bonds with a metal. In other words, after formation of nanoparticles by application of energy has been performed, the dielectric organic material may bond to the metal of the nanoparticles (i.e., the metal of the metal ions attached to the substrate by the linkers) either by applying to the channel region a solution of the dielectric organic material that spontaneously bonds with the metal ions attached to the substrate by linkers, or by supplying the dielectric organic material in the gaseous state to the channel region, thereby forming composite nanoparticles having a core-shell structure including nanoparticle cores and dielectric shells. According to this method, a very uniform dielectric layer may be formed on fine nanoparticles and more reliable isolation between the nanoparticles may be ensured.

The dielectric organic material 150 that is used in the present disclosure may be any dielectric material having a functional group that bonds with the metal contained in the nanoparticles. In a specific embodiment, the dielectric organic material that spontaneously bonds with the metal contained in the nanoparticles may include, at one end, a functional group such as a thiol group (—SH), a carboxyl group (—COOH) and/or an amine group (—$NH_2$) that may spontaneously form a chemical bond with the metal contained in the nanoparticles, and at the other end, a functional group such as a methyl group that does not react with the metal contained in the nanoparticles, and as the backbone, an alkane chain that enables the formation of a uniform dielectric layer. The thickness of the dielectric layer (shell) may be controlled by the carbon number of the alkane chain, and the dielectric organic material may have a $C_3$-$C_{20}$ alkane chain.

The layer composed of the metallic nanoparticles 140 and the dielectric organic material 150 may form a nano floating gate. The weight ratio between the metallic nanoparticles and the dielectric organic material in the nano floating gate may be about 1:0.5 to 10. This weight ratio between the metallic nanoparticles 140 and the dielectric organic material 150 may stably prevent current from flowing through the nanoparticles and provide the floating gate with physical stability. This weight ratio between the nanoparticles and the dielectric organic material may be controlled by the amount of dielectric organic material that is supplied to the substrate having the nanoparticles formed therein. In addition, when applying a dielectric organic material. 150 that spontaneously bonds with metal atoms present in the nanoparticles 140, the weight ratio between the nanoparticles 140 and the dielectric organic material 150 may also be controlled by the carbon number of the alkane chain of the dielectric organic material 150, as described above.

Referring to FIG. 2E, the nano floating gate formed through the fabrication method in accordance with the first embodiment of the present invention will be described in detail.

Referring to FIG. 2E, the nano floating gate in accordance with the first embodiment of the present invention may include linkers 120A formed over a substrate 110, and metallic nanoparticles 140 that are grown from metal ions 130 bonded to the linkers 120A. The nano floating gate may further include a dielectric organic material 150 bonded to the surface of the metallic nanoparticles 140.

The substrate 110 may include a surface layer 114 having functional groups (not shown) suitable for bonding to the linkers 120A.

The substrate 110 may be a flexible substrate, which may include a surface layer 114 having a hydroxyl (—OH) functional group. The flexible substrate may include one or a mixture of two or more selected from among polyethylene terephthalate (PET), polyethylene naphthalate (PEN), polyimide (PI), polycarbonate (PC), polypropylene (PP), triacetyl cellulose (TAC), polyethersulfone (PES), and polydimethylsilozane (PDMS).

The linkers 120A may be organic molecules bonded to the surface of the substrate 110 through self-assembly. The nano floating gate may include a linker layer 120 formed by the linkers 120A bonded to the surface of the substrate 110. The linker layer 120 may be a self-assembled monomolecular layer formed on the surface of the substrate 110. Also, the linker layer 120 may be a silane compound layer having one functional group selected from among an amine group, a carboxylic acid group, and a thiol group. The linkers 120A may include one functional group selected from among an amine group, a carboxylic acid group, and a thiol group. Each of the linkers 120A may include a first functional group (which is denoted by 122 in FIG. 2A) bonded to the surface of the substrate 110, a second functional group (which is denoted by 126 in FIG. 1B) bonded to metal ions 130, and a chain group (which is denoted by 124 in FIG. 2A) for connecting the first functional group and the second functional group.

The metallic nanoparticles 140 may be selected from among metal nanoparticles, metal oxide nanoparticles, metal nitride nanoparticles, metal carbide nanoparticles, and intermetallic compound nanoparticles. The metallic nanoparticles 140 may be grown by bonding metal ions 130 to the linkers 120A and then growing the metal ions 130.

The size of the metallic nanoparticles 140 may be controlled according by the energy application conditions during the growth of the metallic nanoparticles 140. Also, the size of nanoparticles may be controlled before or during the application of energy to the metallic nanoparticles 140 by applying a surfactant. The surfactant may be an organic surfactant, and the surfactant may remain on the surface of the metallic nanoparticles 140 after the growing of the metallic nanoparticles 140 is finished. According to an embodiment of the present disclosure, when no surfactant is used, the metallic nanoparticles 140 may have a particle diameter of about 2.0 to 3.0 nm. According to another embodiment of the present disclosure, when a single kind of surfactant is used, the metallic nanoparticles 140 may have a particle diameter of about 1.3 to 1.6 nm. According to another embodiment of the present disclosure, when multiple surfactants of different kinds are used, the metallic nanoparticles 140 may have an average particle diameter of about 0.5 to 1.2 nm.

Metallic nanoparticles 140 that are separately arranged on the same plane may form a single nanoparticle layer. This is because, as described above, the nanoparticle layer is formed by applying energy to a layer of the metal ions 130 formed over a substrate by attachment with the linkers. As the nanoparticle layer is formed using linkers 120A, which prevent the nanoparticles from agglomerating, extremely fine nanoparticles may be formed at high density.

According to another embodiment, the nanoparticles of the nanoparticle layer may have an average particle diameter of about 0.5 to 3 nm with a particle radius standard deviation of about ±20% or less, which indicates a highly uniform nanoparticle size distribution, and a nanoparticle density (which is the number of the nanoparticles per unit area) of about $10^{13}$ to $10^{15}$/cm$^2$.

According to another embodiment, the average particle diameter of the nanoparticles of the nanoparticle layer may range from about 2 to 3 nm. As the data storage node of a floating gate may have extremely fine nanoparticles with an average particle diameter of about 2 to 3 mm, the charge distribution in the floating gate may be uniform, which leads to excellent operation stability and an improved life cycle. Also, since the nanoparticles 140 are prepared by applying energy to the metal ions 130 that are bonded by the linkers on a tunneling insulation layer, the metal ions 130 may be particlized into nanoparticles while, simultaneously, the formed nanoparticles maintain separation from each other. This prevents current from flowing through the nanoparticles and gives the nanoparticles excellent charge retention capability. Also, since the nanoparticles are formed by applying energy to metal ions 130 that are bonded by linkers 120A on a tunneling insulation layer, the nanoparticles 140 of the nanoparticle layer may have an average particle diameter of about 2 to 3 nm with a particle radius standard deviation of about ±20%. This excellent uniformity may prevent deviations in the energy levels at which charges are trapped based on the quantum confinement effect of the nanoparticles. Therefore, the memory device may operate reliably and stably. The density of the nanoparticles of the nanoparticle layer may range from about $10^{13}$ to $10^{15}$/cm$^2$, and specifically, the nanoparticle density may range from about $0.1 \times 10^{14}$ to $10 \times 10^{14}$/cm$^2$ when the average particle diameter of the nanoparticles ranges from about 2 to 3 nm. Since this high nanoparticle density causes a great change in breakdown voltage before and after the charges are trapped, the memory device may be scaled down and reduce power consumption while performing stable and reproducible operations. For example, the channel length, from source to drain, may range from about 5 to 200 nm, and the width of the channel may range from about 5 to 1000 nm and, specifically, from about 10 to 500 nm and, more specifically, from about 10 to 200 nm. Due to the fine particle size and excellent uniformity, the memory device may be suitable for storing a charge that is more than twice that of a typical nano floating gate memory device.

According to another embodiment, the average particle diameter of the nanoparticles of the nanoparticle layer may range from about 1.3 to 1.9 nm and, specifically, about 1.4 to 1.8 nm. When the average particle diameter of the nanoparticles of the nanoparticle layer ranges from about 1.3 to 1.9 nm and, specifically, from about 1.4 to 1.8 nm, a program operation and an erase operation may be performed by the transfer of a single charge (which is a single electron or a single hole). The transfer of a single charge (a single electron or a single hole) makes it possible to control charge storage with an extremely small voltage difference of about 0.26V, which is an advantageous feature. Since charging operations occur step by step according to the voltage level, not only may a single level cell be realized, but also a multi-level cell. In other words, when the average particle diameter of the nanoparticles range from about 1.3 to 1.9 nm, or more specifically from about 1.4 to 1.8 nm, the charging operation occurs step by step (i.e. electron by electron, or hole by hole), and each individual electron or hole added may correspond to an additional piece of stored information.

As the nanoparticles are formed by applying energy to the metal ions 130 that are bonded by the linkers 120A on the tunneling insulation layer, the nanoparticles 140 of the nanoparticle layer may have an average diameter of about 1.3 to 1.9 nm and, specifically, about 1.4 to 1.8 nm with a particle radius standard deviation of about ±20%. This excellent uniformity provides stable and uniform charge trapping sites so that stable and reproducible operations may be performed. Also, since the nanoparticles are formed by applying energy to the metal ions 130 that are bonded by the linkers 120A on the tunneling insulation layer, the density of the nanoparticles of the nanoparticle layer may range from about $10^{13}$ to $10^{15}/cm^2$ and, specifically, the nanoparticle density may range from about $0.2 \times 10^{14}$ to $20 \times 10^{14}/cm^2$ when the average particle diameter of the nanoparticles ranges from about 1.3 to 1.9 nm. Since the nanoparticles are highly uniform, highly dense, and have separation, the charge stored in the floating gate may be uniform and stable and the floating gate may have excellent charge retention characteristics. Also, the memory device including the nanoparticles may operate at low voltage and be scaled down to reduce power consumption without damaging its performance life cycle or driving stability.

According to another embodiment, the average particle diameter of the nanoparticles of the nanoparticle layer may be about 1.2 nm or less and, specifically, the average particle diameter of the nanoparticles of the nanoparticle layer may range from about 0.5 to 1.2 nm and, more specifically, from about 0.8 to 1.2 nm. When the average particle diameter of the nanoparticles of the nanoparticle layer is about 1.2 nm or less and, specifically, when the average particle diameter of the nanoparticles of the nanoparticle layer ranges from about 0.5 to 1.2 nm and, more specifically, from about 0.8 to 1.2 nm, there is an energy gap between the electrons highest energy potential, where the electrons may exist, and the electrons lowest energy potential, where the electrons do not exist. Due to the energy gap, the potential window of program and erase operations is broadened and the charge retention capability and endurance are improved.

Since the nanoparticles 140 are formed by applying energy to the metal ions 130 bonded by the linkers 120A on the tunneling insulation layer, the average particle diameter of the nanoparticles of the nanoparticle layer may be about 1.2 nm or less and, specifically, the average particle diameter of the nanoparticles of the nanoparticle layer may range from about 0.5 to 1.2 nm and, more specifically, from about 0.8 to 1.2 nm with a particle radius standard deviation of about ±20%. This excellent uniformity provides stable and uniform charge trapping sites so that stable and reproducible operations may be performed.

The density of the nanoparticles of the nanoparticle layer may range from about $10^{13}$ to $10^{15}/cm^2$ and, specifically, the nanoparticle density may range from about $0.2 \times 10^{14}$ to $30 \times 10^{14}/cm^2$ when the average particle diameter of the nanoparticles is about 1.2 nm or less and, specifically, when the average particle diameter of the nanoparticles of the nanoparticle layer ranges from about 0.5 to 1.2 nm and, more specifically, from about 0.8 to 1.2 nm. This high nanoparticle density causes a dramatic change in the breakdown voltage before and after the charges are trapped. Therefore, the memory device may be scaled down to reduce power consumption. For example, the channel length, from source to drain, may range from about 5 to 200 nm, and the width of the channel may range from about 5 to 1000 nm and, specifically, from about 10 to 500 nm and, more specifically, from about 10 to 200 nm.

The dielectric organic material 150 may be bonded to the surface of the grown metallic nanoparticles 140. The dielectric organic material 150 prevents current from flowing through the metallic nanoparticles 140. The surface of the metallic nanoparticles 140 may be coated with the dielectric organic material 150, and the dielectric organic material 150 may fill the space between the metallic nanoparticles 140 that are arranged separately from each other. When a surfactant is supplied to the metal ions 130, which is the state of the metallic nanoparticles 140 before the metallic nanoparticles 140 are grown, or the nanoparticles during energy application, the surfactant may remain on the surface of the metallic nanoparticles 140. Since the surfactant may be a dielectric organic material, further addition of dielectric organic material 150 may not be necessary. Also, although not illustrated in the drawings, another dielectric material may be formed between the metallic nanoparticles 140 that are coated with the dielectric organic material 150.

Metallic nanoparticles 140 may be separately arranged over the linker layer 120 to form a nanoparticle layer. The nanoparticle layer may include a dielectric organic material (or an organic surfactant) bonded to or coating the surface of the metallic nanoparticles. Also, although not illustrated in the drawings, an additional dielectric material may be formed between the metallic nanoparticles 140 that are coated with the dielectric organic material 150. In other words, after the dielectric organic material 150 is formed, an inorganic oxide material, may be additionally formed in order to fix the metallic nanoparticles 140 more stably. Also, an inorganic oxide (not shown) material may be additionally formed directly without the dielectric organic material 150.

The nano floating gate in accordance with the first embodiment of the present disclosure may have a vertical multi-stack structure. In other words, the nano structure may have a stacked structure where the linker layer 120 and the nanoparticle layer are stacked alternately and repeatedly. A dielectric layer suitable for being bonded to the linkers of an upper linker layer may be further included. If the dielectric material forming the lower nanoparticle layer has functional groups suitable for bonding to the linkers of the upper linker layer, a further dielectric layer between the lower nanoparticle layer and the upper linker layer may not be needed. In short, whether to form the dielectric layer between the lower nanoparticle layer and the upper linker layer may be decided based on the kind of dielectric material that forms the nanoparticle layer.

[Improved Nano Floating Gate and Method for Forming the Same in Accordance with a Second Embodiment of the Present Invention]

FIGS. 3A to 3D are cross-sectional views describing a method for forming a nano floating gate in accordance with a second embodiment of the present disclosure.

Figure 3A:
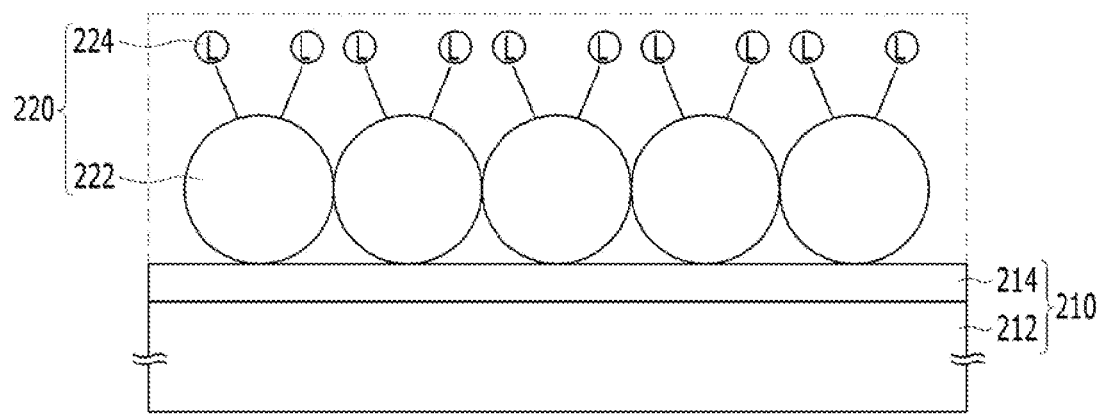
FIGS. 3A to 3D are cross-sectional views describing a method for forming a nano floating gate in accordance with a second embodiment of the present disclosure.
Figure 3B:
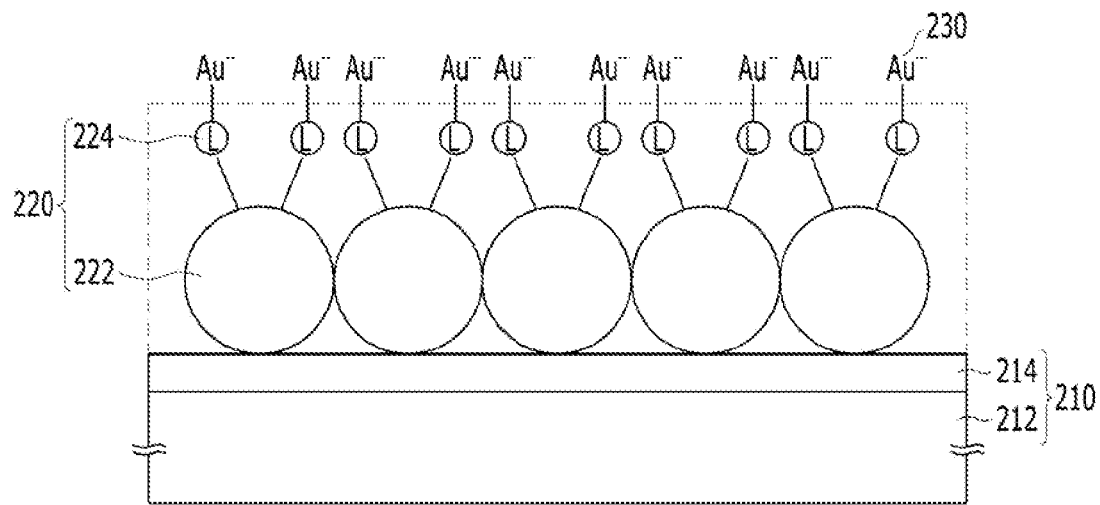
Figure 3C:
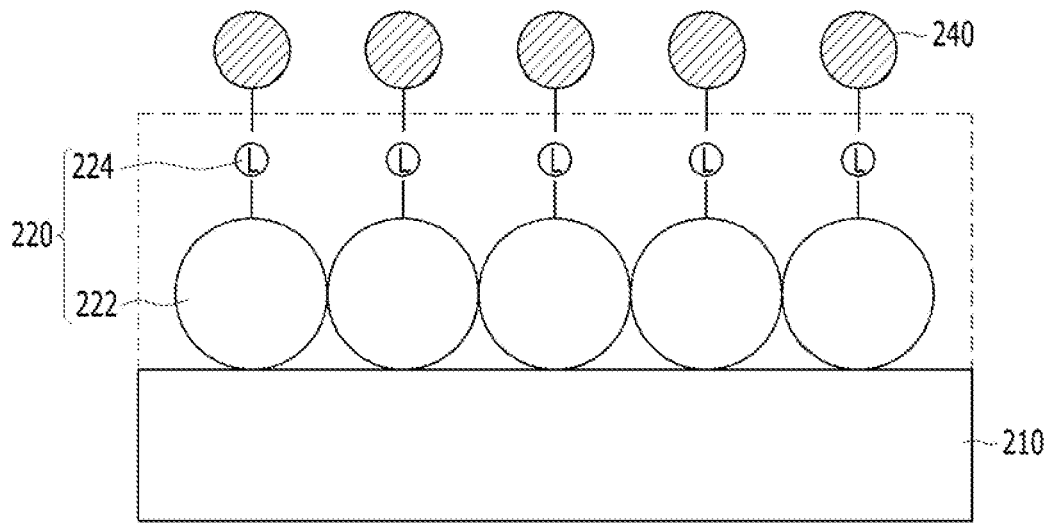

The method for fabricating the nano floating gate in accordance with the second embodiment of the present disclosure may include forming dielectric material particle supporters 222 bonded to linkers 224 on the surface of a substrate 210 (refer to FIG. 3A), bonding metal ions 230 to the linkers 224 (refer to FIG. 3B), and transforming the metal ions 230 into metallic nanoparticles 240 by applying energy to the metallic nanoparticles 240 (refer to FIG. 3C). Also, the method may include supplying a dielectric organic material 250 to the structure where the metallic nanoparticles 240 are formed (refer to FIG. 3D). The method may further include supplying one or multiple kinds of organic surfactant before or during the application of energy.

FIG. 3A shows a substrate 210 where dielectric material particle supporters 222 are bonded to the linkers 224. The substrate 210 may include a silicon substrate 212 and a surface layer 214 formed over the silicon substrate 212. The surface layer 214 may be a silicon oxide layer that functions as a tunneling insulation layer.

The substrate 210 may be a flexible substrate or a transparent substrate. When a flexible substrate is used, the surface layer 214 of the substrate 210 may be an organic material having hydroxyl (—OH) functional groups.

In the second embodiment of the present disclosure, the substrate 210 may have the materials and structures described in the first embodiment of the present disclosure.

The dielectric material particle supporters 222 bonded to the linkers 224 are formed in plural over the substrate 210 to form a supporter layer 220.

Fabricating the supporter layer 220 bonded to the linkers 224 may include preparing a supporter layer material by mixing a dielectric material powder in a linker solution obtained by dissolving the linkers 224 in a solvent and depositing the supporter layer material on the substrate 210. A spin-coating method to apply the supporter layer material on the substrate 210 may be used, or a liquid deposition method of immersing the substrate 210 in a solution where the supporter layer material is dissolved may be used.

The dielectric material particle supporters 222 may include an oxide having at least one element selected from among metals, transition metals, post-transition metals, and metalloids. Also, the dielectric material particle supporters 222 may include at least one material selected from among a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, a hafnium silicate and polymers.

The linkers 120A may be organic molecules that are suitable for being chemically bonded to or adsorbed on the surface of the dielectric material particle supporters 222 and of being chemically bonded to the metal ions 230. To be specific, the linkers 224 may be organic molecules that include a first functional group suitable for being chemically bonded to or adsorbed on the surface of the dielectric material particle supporters 222 and a second functional group suitable for being chemically bonded to metal ions, which are to be formed subsequently. The linkers 224 may also include a chain functional group for connecting the first functional group and the second functional group to each other. The linkers 224 may include one functional group suitable for bonding to metal ions which is selected from among an amine group, a carboxylic acid group, and a thiol group. As for the linkers 224, diverse examples described in the first embodiment of the present invention may be applied.

FIG. 3B shows metal ions 230 bonded to the linkers 224. The metal ions 230 may be bonded to the functional groups of the linkers 224. The metal ions 230 may be formed by supplying a metal precursor to the substrate (having the linkers formed thereon). Specifically, the metal ions 230 may be formed by applying a metal precursor solution to the substrate 210 or applying a gaseous metal precursor to the substrate 210. The method for bonding the metal ions 230 to the linkers 224 and the materials used for the method may be as diverse as described above when the first embodiment of the present disclosure is described.

FIG. 3C shows metallic nanoparticles 240 formed by applying energy and growing the metal ions 230. The energy that is applied to form the nanoparticles may be one or more selected from among heat energy, chemical energy, light energy, vibration energy, ion beam energy, electron beam energy, and radiation energy. The diverse embodiments may be the same as or similar to those of the first embodiment of the present disclosure.

In a fabrication method according to a second embodiment of the present disclosure, i) the size of nanoparticles may be controlled by supplying an organic surfactant that bonds to or is adsorbed on the metal ions, followed by application of energy. Otherwise, ii) the size of nanoparticles may be controlled during the growth thereof by supplying an organic surfactant that bonds to or is adsorbed on the metal ions during the application of energy. This supply of organic surfactant may be optionally performed during the fabrication process. Instead of using a single kind of organic surfactant, multiple kinds may be used.

To more effectively inhibit the transfer of the metal ions, a first organic material and a different kind of second organic material may be used as the surfactants.

The first organic material may be a nitrogen- or sulfur-containing organic compound. For example, the sulfur-containing organic material may include a linear or branched hydrocarbon compound having a thiol group at one end. In a specific example, the sulfur-containing organic compound may be one or more selected from among HS—$C_n$—$CH_3$ (n: an integer ranging from 2 to 20), n-dodecyl mercaptan, methyl mercaptan, ethyl mercaptan, butyl mercaptan, ethylhexyl mercaptan, isooctyl mercaptan, tert-dodecyl mercaptan, thioglycolacetic acid, mercaptopropionic acid, mercaptoethanol, mercaptopropanol, mercaptobutanol, mercaptohexanol and octyl thioglycolate.

The second organic material may be a phase-transfer catalyst-based organic compound, for example, quaternary ammonium or a phosphonium salt. More specifically, the second organic surfactant may be one or more selected from among tetraocylammonium bromide, tetraethylammonium, tetra-n-butylammonium bromide, tetramethylammonium chloride, and tetrabutylammonium fluoride.

The organic surfactant that is supplied before or during the application of energy may be bonded to or adsorbed on the nuclei of the metal ions or the metal ions bonded to the linkers, and the nucleation and growth of nanoparticles by the applied energy may be controlled by the organic surfactant(s) that are bonded to or adsorbed on the metal ions. In other words, it is possible to grow the metallic nanoparticles 240 to be fine and uniform.

Figure 3D:
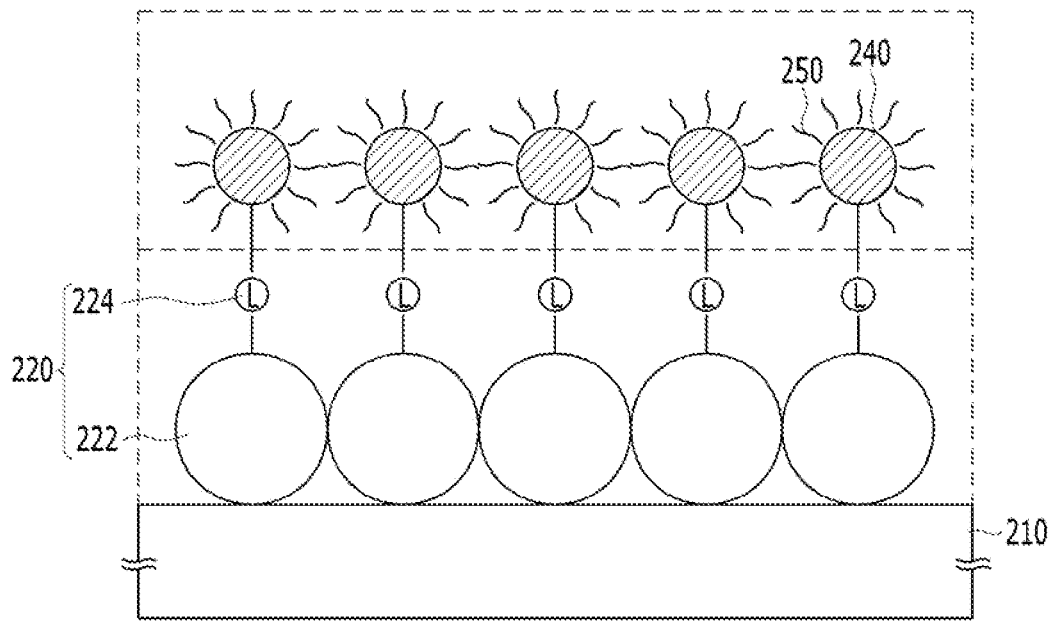

FIG. 3D shows a dielectric organic material 250 bonded to the metallic nanoparticles 240 grown by application of energy. The dielectric organic material 250 may coat the surface of the metallic nanoparticles 240 or fill the gaps between the metallic nanoparticles 240. The dielectric organic material 250 may provide isolation between the nanoparticles to more reliably prevent the flow of current between nanoparticles.

If a sufficient amount of the organic surfactant was supplied in the preceding action, that is, if the organic surfactant that is applied before or during the application of energy remains on the surface of the grown nanoparticles to provide sufficient isolation between the grown nanoparticles, the dielectric organic material 250 does not need to be added to the surface of the grown nanoparticles 240. In other words, because whether the organic surfactant is used is determined according to the desired size of nanoparticles to be formed, the formation of an additional dielectric organic material 250 is optional. The method for forming the dielectric organic material 250 and the materials used in that method may be the same or similar to that of the first embodiment of the present disclosure.

In the second embodiment of the present disclosure, the method for forming the dielectric organic material 250 and the materials used for the method may be the same as or similar to those of the first embodiment of the present disclosure.

Referring to FIG. 3D, the nano floating gate formed through the fabrication method in accordance with the second embodiment of the present invention is described in detail.

Referring to FIG. 3D, the nano floating gate in accordance with the second embodiment of the present invention may include dielectric material particle supporters 222 formed over a substrate 210 and bonded to the linkers 224, and metallic nanoparticles 240 that are grown from metal ions 230 bonded to the linkers 224. Also, the nano floating gate may further include a dielectric organic material 250 bonded to the surface of the metallic nanoparticles 240.

The substrate 210 may include a surface layer 214 that acts as a tunneling insulation layer. The surface layer 214 may include an oxide layer. To be specific, non-limiting examples of the surface layer 214 of the substrate 210 may be a layer of at least one material selected from a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, and a hafnium silicate.

The substrate 210 may be a flexible substrate, which may include a surface layer 214 having a hydroxyl (—OH) functional group. The flexible substrate may include one or a mixture of two or more selected from among polyethylene terephthalate (PET), polyethylene naphthalate (PEN), polyimide (PI), polycarbonate (PC), polypropylene (PP), triacetyl cellulose (TAC), polyethersulfone (PES), and polydimethylsiloxane (PDMS).

The dielectric material particle supporters 222 may be oxide particles having at least one element selected from metals, transition metals, post-transition metals, and metalloids. The dielectric material particle supporters 222 may have an average particle diameter of about 10 to 20 nm. The dielectric material particle supporters 222 may be one or more dielectric material particle supporter in thickness.

Also, the dielectric material particle supporters 222 may include at least one material selected from a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, a hafnium silicate and polymers.

The linkers 224 may be organic molecules. The nano floating gate may include a linker layer formed of linkers 224 bonded to the surface of the substrate 210. The linker layer may be a self-assembled monomolecular layer formed on the surface of the dielectric material particle supporters 222. The linkers 224 may include one functional group selected from an amine group, a carboxylic acid group, and a thiol group. Each of the linkers 120A may include a first functional group bonded to the surface of the dielectric material particle supporters 222, a second functional group bonded to metal ions 230, and a chain group for connecting the first functional group and the second functional group to each other.

The metallic nanoparticles 240 may be selected from metal nanoparticles, metal oxide nanoparticles, metal nitride nanoparticles, metal carbide nanoparticles, and intermetallic compound nanoparticles. The metallic nanoparticles 240 are grown by bonding metal ions to the linkers 224 and then growing the metal ions.

The size of the metallic nanoparticles 240 may be controlled by the energy application conditions during the growth of the metallic nanoparticles 240. Also, the size of nanoparticles may be controlled before energy application by whether a surfactant is supplied. The surfactant may be an organic surfactant, and the surfactant may remain on the surface of the metallic nanoparticles 240 after the growth of the metallic nanoparticles 240. According to an embodiment of the present disclosure, when no surfactant is used, the metallic nanoparticles 240 may have an average particle diameter of about 2.0 to 3.0 nm. According to another embodiment of the present disclosure, when a single kind of surfactant is used, the metallic nanoparticles 240 may have an average particle diameter of about 1.3 to 1.6 nm. According to another embodiment of the present disclosure, when multiple kinds of surfactants are used, the metallic nanoparticles 240 may have an average particle diameter of about 0.5 to 1.2 nm. The metallic nanoparticles 240 used in this embodiment may be the same as or similar to those described above in the first embodiment of the present invention.

The dielectric organic material 250 may be bonded to the surface of the grown metallic nanoparticles 240. The dielectric organic material 250 prevents current from flowing through the metallic nanoparticles 240. The surface of the metallic nanoparticles 240 may be coated with the dielectric organic material 250, and the dielectric organic material 250 may fill the space between the metallic nanoparticles 240 that are separately arranged from each other. When a surfactant is supplied to the metal ions 230, which is the state of the metallic nanoparticles 240 before the metallic nanoparticles 240 are grown, or during the growth of the nanoparticles, the surfactant may remain on the surface of the metallic nanoparticles 240. Since the surfactant may be a dielectric organic material, further application of the dielectric organic material 250 may not be required.

Also, although not illustrated in the drawing, another dielectric material may be additionally formed between the metallic nanoparticles 240 that are coated with the dielectric organic material 250.

The metallic nanoparticles 240 may be arranged separately from each other to form a nanoparticle layer. The nanoparticle layer includes a dielectric organic material (or an organic material for a surfactant) bonded to or coating the surface of the metallic nanoparticles 240. The nanoparticle layer may further include a dielectric material that fills the gaps between the coated nanoparticles 240.

The nano floating gate in accordance with the second embodiment of the present disclosure may have a vertical multi-stack structure. In other words, the nano structure may have a stacked structure where the supporter layer 220, which is bonded to the linkers 224, and the nanoparticle layer are stacked alternately and repeatedly. A dielectric layer, such as an oxide layer, may be further included between the lower nanoparticle layer and the upper supporter layer. If the dielectric organic material 250 forming the lower nanoparticle layer has a functional group capable bonding to the upper supporter layer, the additional dielectric layer may not need to be formed. In short, whether to form the dielectric layer may be decided based on the kind of dielectric organic material 250 applied.

According to the embodiments of the present invention, since the nano-floating gate memory device includes a floating gate that is formed of high-density nanoparticles that are extremely fine and have uniform particle size, the nano-floating gate memory device may be scaled down to reduce power consumption. Also, even when scaled down, the nano-floating gate memory device has excellent operation stability, reproducibility, and reliability. Since the nanoparticles are fixed with insulating linkers, the nanoparticles not only have excellent physical stability but also prevent the stored charges from being lost when the tunneling insulation layer is damaged.

According to the embodiments of the present invention, the nanoparticles of a floating gate are directly formed through a simple process of forming a metal ion layer, attached by linkers, and applying energy to the metal ion layer. Because of this method, it is possible to form a nano floating gate having extremely fine, high-density, uniformly sized nanoparticles through an easy, simple, rapid, and cost-saving process. Also, as the nanoparticles of the floating gate are formed in-situ, wasteful consumption of raw materials may be minimized.

Although various embodiments have been described for illustrative purposes, it will be apparent to those skilled in the art that various changes and modifications may be made without departing from the spirit and scope of the disclosure as defined in the following claims.

What is claimed is:

1. A method for fabricating a non-volatile memory device, comprising:
    forming a tunneling insulation layer over a substrate; and
    forming a floating gate for charging and discharging of charges over the tunneling insulation layer,
    wherein the forming of the floating gate comprises:
    forming a linker layer including linkers over the tunneling insulation layer;
    forming metal ions over the linker layer; and
    forming metallic nanoparticles by growing from the metal ions,
    wherein the metallic nanoparticles are formed through reduction and growth of the metal ions being formed over the linker layer over the tunneling insulation layer prior to forming the metallic nanoparticles.

2. The method of claim 1, wherein the forming of the metallic nanoparticles comprises:
    applying energy to the metal ions.

3. The method of claim 2, wherein the energy includes at least one selected from heat energy, chemical energy, light energy, vibration energy, ion beam energy, electron beam energy, and radiation energy.

4. The method of claim 1, further comprising:
    supplying an organic surfactant of one or more kinds before or during the application of energy.

5. The method of claim 1, further comprising:
    supplying at least one of an inorganic oxide and a dielectric organic material to a structure that includes the metallic nanoparticles.

6. The method of claim 1, wherein the linker layer is formed by applying a linker solution to a surface of the substrate.

7. The method of claim 1, wherein the linker layer is formed through an Atomic Layer Deposition (ALD) process using a gas containing the linkers.

8. The method of claim 1, wherein the linker layer comprises a functional group selected from an amine group ($-NH_2$), a carboxyl group ($-COOH$), and a thiol group ($-SH$).

9. The method of claim 1, wherein the forming of the metal ions comprises:
    applying a metal precursor to a structure where the linkers are bonded.

10. The method of claim 1, wherein the forming of the metal ions comprises:
    applying a metal precursor solution in which the metal precursor is dissolved to a structure where the linkers are bonded, or supplying a gas-phase metal precursor to the structure where the linkers are bonded.

11. A method for fabricating a non-volatile memory device, comprising:
    forming a tunneling insulation layer over a substrate; and
    forming a floating gate, suitable for charging and discharging of charges, over the tunneling insulation layer,
    wherein the forming of the floating gate comprises:
    forming dielectric material particle supporters over the tunneling insulation layer;
    forming a linker layer, including linkers, on a surface of the dielectric material particle supporters;
    forming metal ions over the linker layer; and
    forming metallic nanoparticles by growing from the metal ions,
    wherein the metallic nanoparticles are formed through reduction and growth of the metal ions being formed over the linker layer over the tunneling insulation layer prior to forming the metallic nanoparticles.

12. The method of claim 11, wherein the forming of the dielectric material particle supporters and the linker layer comprises:
    preparing a supporter solution by mixing dielectric material particle supporters and linkers in a solvent; and
    coating the substrate with the supporter solution or depositing the supporter solution on the substrate.

13. The method of claim 11, wherein the forming the metallic nanoparticles comprises:
    applying energy to the metal ions.

14. The method of claim 13, further comprising:
    supplying an organic surfactant of one or more kinds before or during the application of energy.

15. The method of claim 13, wherein the energy is at least one selected from heat energy, chemical energy, light energy, vibration energy, ion beam energy, electron beam energy, and radiation energy.

16. The method of claim 11, further comprising:
    supplying at least one of an inorganic oxide and a dielectric organic material to a structure where the metallic nanoparticles are formed.

17. The method of claim 11, wherein each of the linkers comprises a functional group selected from among an amine group ($-NH_2$), a carboxyl group ($-COOH$), and a thiol group ($-SH$) that is suitable for bonding to the metal ions.

18. The method of claim 11, wherein the forming of the metal ions comprises:
    applying a metal precursor to a structure where the linkers are bonded.

19. The method of claim 11, wherein the forming of the metal ions comprises:
    applying a metal precursor solution, where metal precursors are dissolved, to a structure where the linkers are bonded, or supplying a gas-phase metal precursor to the structure where the linkers are bonded.

* * * * *